US012563832B2

(12) United States Patent
Kim

(10) Patent No.: US 12,563,832 B2
(45) Date of Patent: Feb. 24, 2026

(54) DISPLAY APPARATUS AND METHOD OF MANUFACTURING THE SAME

(71) Applicant: Samsung Display Co., Ltd., Yongin-si (KR)

(72) Inventor: Byoungyong Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 741 days.

(21) Appl. No.: 17/966,191

(22) Filed: Oct. 14, 2022

(65) Prior Publication Data

US 2023/0123511 A1 Apr. 20, 2023

(30) Foreign Application Priority Data

Oct. 14, 2021 (KR) ......................... 10-2021-0136894
Jul. 27, 2022 (KR) ......................... 10-2022-0093457

(51) Int. Cl.
*H10D 86/01* (2025.01)
*H10D 86/40* (2025.01)

(52) U.S. Cl.
CPC ..... *H10D 86/0212* (2025.01); *H10D 86/0231* (2025.01); *H10D 86/0241* (2025.01); *H10D 86/443* (2025.01); *H10D 86/411* (2025.01)

(58) Field of Classification Search
CPC ........... H10D 86/0212; H10D 86/0231; H10D 86/0241
See application file for complete search history.

(56) References Cited

U.S. PATENT DOCUMENTS

| | | | |
|---|---|---|---|
| 8,144,140 B2 | 3/2012 | Nishikawa et al. | |
| 9,349,758 B2 | 5/2016 | Ki et al. | |
| 10,684,524 B2 | 6/2020 | Collins et al. | |
| 10,690,488 B2 | 6/2020 | Pesach et al. | |
| 10,756,697 B2 | 8/2020 | Plesski et al. | |
| 11,056,630 B2 | 7/2021 | Hong et al. | |
| 2020/0259056 A1* | 8/2020 | Hong ................ H10D 86/0212 | |

FOREIGN PATENT DOCUMENTS

| | | |
|---|---|---|
| CN | 109887971 A | 6/2019 |
| KR | 101495155 B1 | 2/2015 |
| KR | 1020200099066 A | 8/2020 |

* cited by examiner

*Primary Examiner* — Peter M Albrecht
(74) *Attorney, Agent, or Firm* — CANTOR COLBURN LLP

(57) ABSTRACT

A method of manufacturing the display apparatus includes: attaching a removable first film to one of an upper surface and a lower surface of a substrate, adjacent to a side surface of the substrate; hydrophilic-treating a first region of the side surface of the substrate, where the side surface includes the first region and a second region; providing an organic film pattern on the first region after the hydrophilic-treating; providing a metal layer on the first region and the second region after forming the organic film pattern; and forming a connection wire by removing the organic film pattern and portions of the metal layer on the first region.

18 Claims, 15 Drawing Sheets

FIG. 12

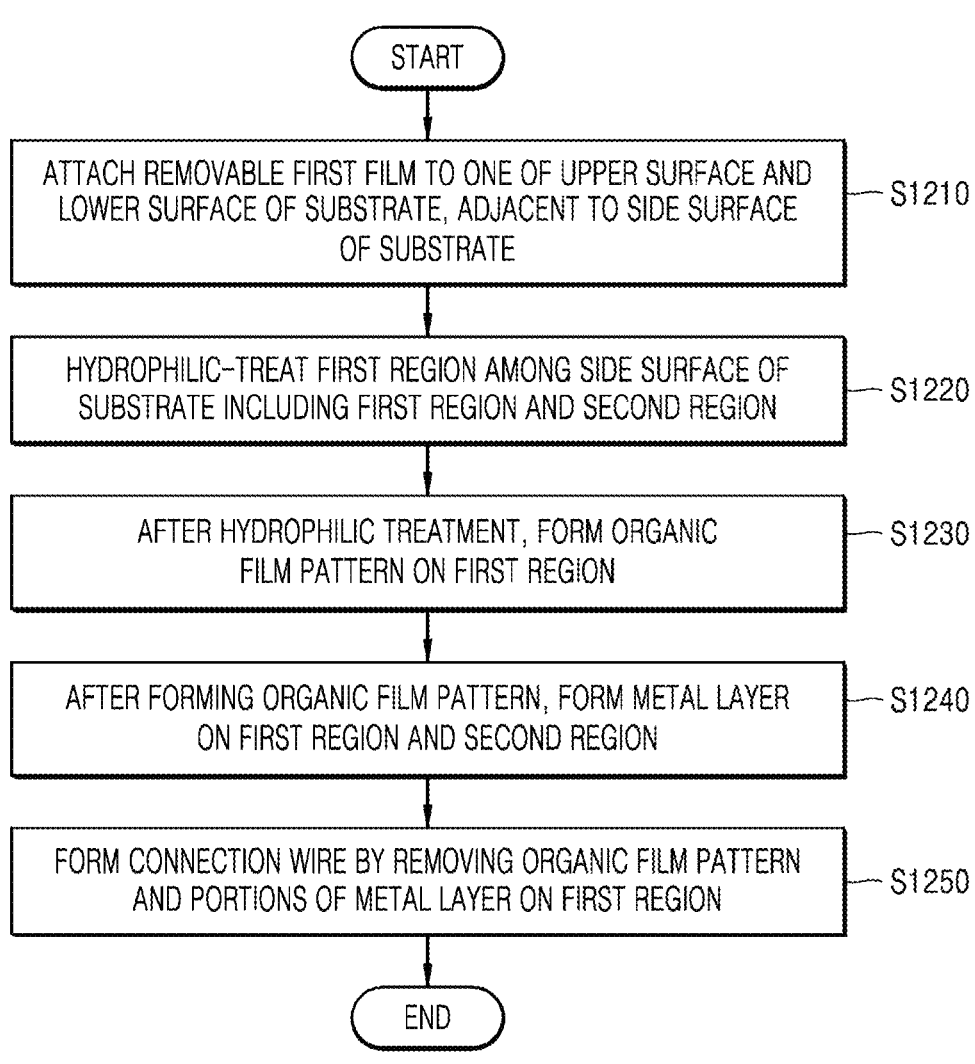

START

ATTACH REMOVABLE FIRST FILM TO ONE OF UPPER SURFACE AND LOWER SURFACE OF SUBSTRATE, ADJACENT TO SIDE SURFACE OF SUBSTRATE — S1210

HYDROPHILIC-TREAT FIRST REGION AMONG SIDE SURFACE OF SUBSTRATE INCLUDING FIRST REGION AND SECOND REGION — S1220

AFTER HYDROPHILIC TREATMENT, FORM ORGANIC FILM PATTERN ON FIRST REGION — S1230

AFTER FORMING ORGANIC FILM PATTERN, FORM METAL LAYER ON FIRST REGION AND SECOND REGION — S1240

FORM CONNECTION WIRE BY REMOVING ORGANIC FILM PATTERN AND PORTIONS OF METAL LAYER ON FIRST REGION — S1250

END

FIG. 13

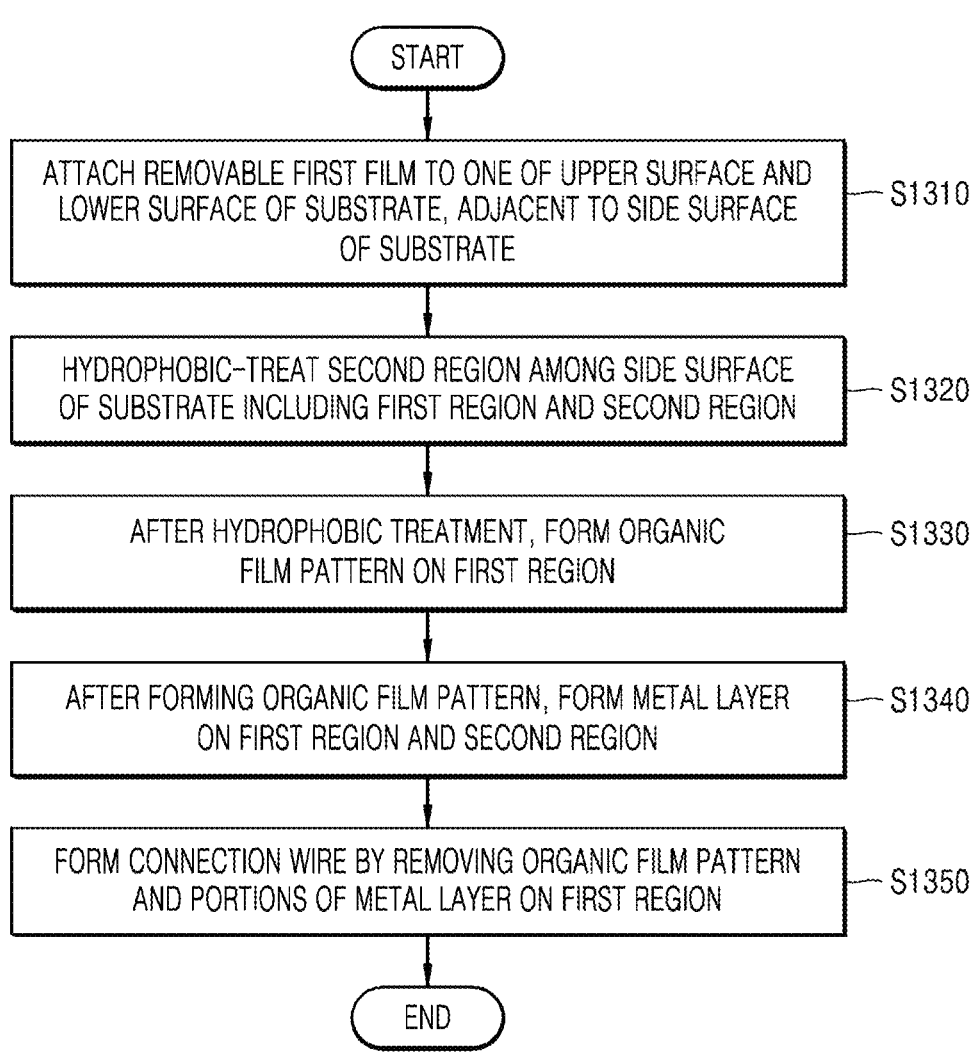

START

ATTACH REMOVABLE FIRST FILM TO ONE OF UPPER SURFACE AND LOWER SURFACE OF SUBSTRATE, ADJACENT TO SIDE SURFACE OF SUBSTRATE —— S1310

HYDROPHOBIC-TREAT SECOND REGION AMONG SIDE SURFACE OF SUBSTRATE INCLUDING FIRST REGION AND SECOND REGION —— S1320

AFTER HYDROPHOBIC TREATMENT, FORM ORGANIC FILM PATTERN ON FIRST REGION —— S1330

AFTER FORMING ORGANIC FILM PATTERN, FORM METAL LAYER ON FIRST REGION AND SECOND REGION —— S1340

FORM CONNECTION WIRE BY REMOVING ORGANIC FILM PATTERN AND PORTIONS OF METAL LAYER ON FIRST REGION —— S1350

END

DISPLAY APPARATUS AND METHOD OF MANUFACTURING THE SAME

This application claims priority to Korean Patent Application No. 10-2022-0093457, filed on Jul. 27, 2022 and Korean Patent Application No. 10-2021-0136894, filed on Oct. 14, 2021, and all the benefits accruing therefrom under 35 U.S.C. § 119, the content of which in its entirety is herein incorporated by reference.

BACKGROUND

1. Field

One or more embodiments relate to a display apparatus and a method of manufacturing the display apparatus, and more particularly, to a display apparatus, with reduced defects in a manufacturing process thereof, and a method of manufacturing the display apparatus.

2. Description of the Related Art

A plurality of display apparatuses may be arranged in a tiled type to form a display apparatus set or a tile display apparatus that realizes an image. In such a tiled display apparatus, the area of a non-display area between the plurality of display apparatuses is desired to be minimized to thereby minimize a distance between display areas of the plurality of display apparatuses to improve image quality. In such a display apparatus, the area of the non-display area may be reduced by arranging, on a lower surface of a substrate, components which used to be located in the non-display area, and electrically connecting components arranged on an upper surface of the substrate to the components on the lower surface of the substrate via wires formed on the sides of the substrate.

SUMMARY

In a display apparatus, where components which is conventionally located in the non-display area are arranged on a lower surface of a substrate, and components arranged on an upper surface of the substrate is electrically connected to the components on the lower surface of the substrate via wires provided on a side of the substrate, defects may occur in a manufacturing process of a display apparatus.

One or more embodiments include a display apparatus for which a defect ratio in a manufacturing process may be reduced.

According to one or more embodiments, a method of manufacturing a display apparatus, includes attaching a removable first film to one of an upper surface and a lower surface of a substrate, adjacent to a side surface of the substrate, hydrophilic-treating a first region of the side surface of the substrate, where the side surface includes the first region and a second region, providing an organic film pattern on the first region after the hydrophilic-treating the first region of the side surface, providing a metal layer on the first region and the second region after the providing the organic film pattern, and forming a connection wire by removing the organic film pattern and portions of metal layer on the first region.

In an embodiment, the hydrophilic-treating the first region of the side surface may include performing a plasma treatment on the first region.

In an embodiment, the hydrophilic-treating the first region of the side surface may include disposing a mask with an opening on the side surface of the substrate in a way such that the opening overlaps the first region, and discharging, to the first region through the opening, plasma generated from a hydrophilic gas.

In an embodiment, the hydrophilic-treating the first region of the side surface may include, while moving a discharge outlet from one end of the side surface to another end of the side surface, discharging plasma generated from a hydrophilic gas, from the discharge outlet to the first region.

In an embodiment, the method may further include hydrophobic-treating the second region after the hydrophilic-treating the first region of the side surface and before the providing the organic film pattern.

In an embodiment, the method may further include attaching a removable second film to the other of the upper surface and the lower surface of the substrate.

In an embodiment, the providing the organic film pattern may include providing one end of the organic film pattern on the first film and another end of the organic film pattern on the second film.

In an embodiment, the forming the connection wire may include detaching the first film and the second film from the substrate.

In an embodiment, the forming the connection wire may include detaching the first film from the substrate.

In an embodiment, the forming the connection wire may include raising a temperature of the substrate to a preset temperature or above and then removing the organic film pattern and the portions of the metal layer on the first region.

In an embodiment, the first region may have a zigzag shape.

In an embodiment, the hydrophilic-treating the first region of the side surface may include disposing, on the side surface of the substrate, a mask with an opening having a zigzag shape in a way such that the opening overlaps the first region, and discharging, to the first region through the opening having the zigzag shape, plasma generated from a hydrophilic gas.

In an embodiment, the forming the connection wire may include detaching the first film from the substrate, where the connection wire has the zigzag shape.

According to one or more embodiments, a method of manufacturing a display apparatus, includes attaching a removable first film to one of an upper surface and a lower surface of a substrate, adjacent to a side surface of the substrate, hydrophobic-treating a second region of the side surface of the substrate, where the side surface includes a first region and the second region, providing an organic film pattern on the first region after the hydrophobic-treating the second region of the side surface, providing a metal layer on the first region and the second region after the providing the organic film pattern, and forming a connection wire by removing the organic film pattern and portions of the metal layer on the first region.

In an embodiment, the hydrophobic-treating the second region of the side surface may include performing a plasma treatment on the second region.

In an embodiment, the hydrophobic-treating the second region of the side surface may include disposing, on the side surface of the substrate, a mask with an opening in a way such that the opening overlaps the second region, and discharging, to the second region through the opening, plasma generated from a hydrophobic gas.

In an embodiment, the hydrophobic-treating the second region of the side surface may include, while moving a discharge outlet from one end of the side surface to another end of the side surface, discharging plasma generated from a hydrophobic gas, from the discharge outlet to the second region.

In an embodiment, the method may further include attaching a removable first masking film to one of the upper surface and the lower surface of the substrate, adjacent to the side surface of the substrate, and attaching a removable second masking film to the other of the upper surface and the lower surface of the substrate.

According to one or more embodiments, a display apparatus includes a substrate, a transistor layer disposed on the substrate, and a connection wire disposed on an upper surface of the substrate, a lower surface of the substrate, and a side surface connecting the upper surface to the lower surface, where the connection wire has a zigzag shape when viewed from a direction perpendicular to the side surface, and is electrically connected to the transistor layer.

In an embodiment, the side surface may include a first chamfered surface adjacent to the upper surface, a second chamfered surface adjacent to the lower surface, and a center surface between the first chamfered surface and the second chamfered surface.

BRIEF DESCRIPTION OF THE DRAWINGS

The above and other features of certain embodiments of the disclosure will be more apparent from the following description taken in conjunction with the accompanying drawings, in which:

FIG. 12 is a flowchart of a method of manufacturing a display apparatus, according to an embodiment; and FIG. 13 is a flowchart of a method of manufacturing a display apparatus, according to an embodiment.

DETAILED DESCRIPTION

Figure 1:
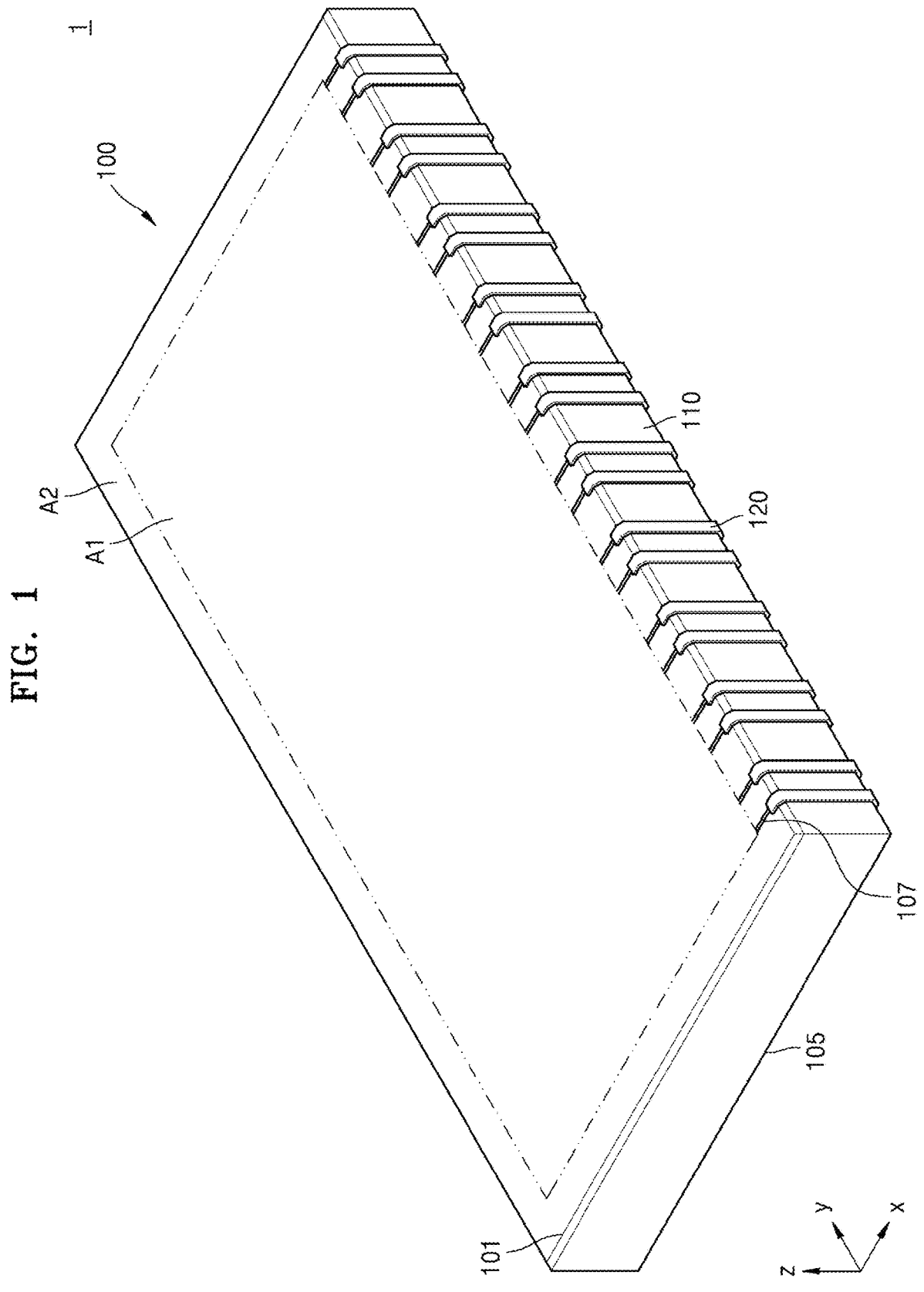
FIG. 1 is a schematic perspective view of a display apparatus including connection wires, according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

Since the disclosure may have various modifications and several embodiments, embodiments are illustrated in the drawings and will be described in detail. The effects and features of the disclosure, and ways to achieve them will become apparent by referring to embodiments that will be described later in detail with reference to the drawings. However, the disclosure is not limited to the following embodiments but may be embodied in various forms.

In the embodiments below, it will be understood when various elements such as a layer, a film, an area, or a plate is referred to as being "on" or "above" another element, it can be directly on or above the other element, or an intervening element may also be present. Also, in the drawings, for convenience of description, sizes of elements may be exaggerated or contracted. For example, since sizes and thicknesses of elements in the drawings are arbitrarily illustrated for convenience of explanation, the following embodiments are not limited thereto.

In the embodiments below, an x-axis, a y-axis, and a z-axis are not limited to three axes on a rectangular coordinates system but may be construed as including these axes. For example, an-x axis, a y-axis, and a z-axis may be at right angles or may also indicate different directions from one another, which are not at right angles.

It will be understood that although the terms "first," "second," etc. may be used herein to describe various elements, these elements should not be limited by these terms. These terms are only used to distinguish one element from another.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an.".

It will be further understood that the terms "comprises" and/or "comprising," or "includes" and/or "including" when used in this specification, specify the presence of stated features, regions, integers, steps, operations, elements, and/ or components, but do not preclude the presence or addition of one or more other features, regions, integers, steps, operations, elements, components, and/or groups thereof.

"Or" means "and/or." As used herein, the term "and/or" includes any and all combinations of one or more of the associated listed items. Herein, "A and/or B" refers to A, B, or A and B. In addition, "at least one of A and B" refers to A, B, or A and B.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the disclosure will be described in detail with reference to the accompanying drawings, and in the description with reference to the drawings, like reference numerals refer to like elements throughout and repetitive detailed descriptions thereof may be omitted or simplified.

FIG. 1 is a schematic perspective view of a display apparatus 1 including a connection wire 120, according to an embodiment. Referring to FIG. 1, an embodiment of the display apparatus 1 may include a substrate 100, on which the connection wire 120 is disposed or formed, and a transistor layer (not shown) on the substrate 100.

The substrate 100 may include an upper surface 101, a lower surface 105 opposite to the upper surface 101, and a side surface 110 connecting the upper surface 101 to the lower surface 105. The side surface 110 of the substrate 100 may include a first chamfered surface 102 (see FIG. 2) adjacent to the upper surface 101, a second chamfered surface 104 (see FIG. 2) adjacent to the lower surface 105, and a center surface 103 between the first chamfered surface 102 and the second chamfered surface 104. In an embodiment, the first chamfered surface 102 and the second chamfered surface 104 may be formed by chamfering edges of the side surface 110 of the substrate 100 by grinding the edges by using a grinding apparatus. In such an embodiment, the first chamfered surface 102 and the second chamfered surface 104 may be polished such that the connection wire 120 is not separated from the first chamfered surface 102 and the second chamfered surface 104, but is sufficiently adhered thereto. Accordingly, the first chamfered surface 102 and the second chamfered surface 104 may have smooth surfaces. This will be described in further detail later.

The substrate 100 may include glass, a metal, or a polymer resin. In an embodiment, for example, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate or cellulose acetate propionate. Various modifications may also be made to the substrate 100. In an embodiment, for example, the substrate 100 may have a multi-layer structure including two layers, each including at least one selected from the above-described polymer resins, and a barrier layer that is between the two layers and includes an inorganic material (e.g., silicon oxide, silicon nitride, or silicon oxynitride).

The upper surface 101 of the substrate 100 may include a display area A1 and a non-display area A2 surrounding the display area A1. A transistor layer may be arranged (or disposed) in the display area A1, and some of wires 107 and some of connection wires 120, which are electrically connected to the transistor layer, may be arranged in the non-display area A2.

The transistor layer may include a thin-film transistor and a light-emitting element. The thin-film transistor may include an active layer, a gate electrode, a source electrode, and a drain electrode. The active layer may include a semiconductor material, and a source region, a drain region, and a channel region between the source region and the drain region are defined in the active layer. The gate electrode may be disposed or formed on the active layer to correspond to the channel region. The source electrode and the drain electrode may be electrically connected to the source region and the drain region of the active layer, respectively. A gate insulating layer including an inorganic insulating material may be arranged between the active layer and the gate electrode as a gate insulating film. An interlayer insulating layer may be arranged between the gate electrode and the source electrode/drain electrode. A planarization layer may be arranged on the source electrode/drain electrode. The interlayer insulating layer and the planarization layer may include an organic insulating material or an inorganic insulating material, or may be formed by alternately arranging an organic insulating material and an inorganic insulating material.

The light-emitting element may emit light of various colors to constitute a red, green, blue, and/or white sub-pixel, and sub-pixels may be arranged in a predetermined pixel arrangement such as stripes, a circle, or a pentile structure. Each light-emitting element may be electrically connected to the thin-film transistor. The light-emitting element may include, for example, an inorganic light-emitting diode or an organic light-emitting diode, but the type of light-emitting elements is not limited thereto.

A buffer layer may be between the substrate 100 and the transistor layer. The buffer layer may prevent penetration of impurity elements through the substrate 100 and planarize a surface of the substrate 100, and may be defined by a single layer or multiple layers, each including an inorganic material such as silicon nitride ($SiN_x$) and/or silicon oxide ($SiO_x$).

A driver may be arranged on the lower surface 105 of the substrate 100. The driver may generate a control signal, and may control an operation of a pixel by providing the generated control signal to the transistor layer. The driver may include a driver integrated circuit ("IC"), but the type of driver is not limited thereto. The driver arranged on the lower surface 105 of the substrate 100 may be electrically connected, via the connection wire 120, to the transistor layer arranged on the upper surface 101 of the substrate 100.

In an embodiment, the connection wire 120 may be arranged on the upper surface 101 of the substrate 100, the lower surface 105 of the substrate 100, and the side surface 110 connecting the upper surface 101 to the lower surface 105. In such an embodiment, the connection wire 120 is arranged on the upper surface 101, the first chamfered surface 102, the center surface 103, the second chamfered surface 104, and the lower surface 105 of the substrate 100, and has a shape continuously extending along the upper surface 101, the first chamfered surface 102, the center surface 103, the second chamfered surface 104, and the lower surface 105 of the substrate 100.

A portion of the connection wire 120 arranged on the lower surface 105 is electrically connected to the driver, and a portion of the connection wire 120 arranged on the upper surface 101 is electrically connected to the wire 107 that is electrically connected to the transistor layer. Accordingly, a control signal generated by the driver may be transmitted to the transistor layer through the connection wire 120.

In an embodiment of the display apparatus 1, the driver of the display apparatus 1 is arranged on the lower surface 105 of the substrate 100, such that the area of the non-display area A2 may be minimized. Accordingly, when one image is realized using a plurality of display apparatuses 1, that is, a tiled display apparatus is defined by the plurality of display apparatuses 1, a distance between display areas A1 of the plurality of display apparatuses 1 may be minimized. Accordingly, the plurality of display apparatuses 1 may realize images with improved quality.

Hereinafter, a method of manufacturing the display apparatus 1 according to an embodiment will be described with reference to FIGS. 2 to 7.

FIGS. 2 to 7 are schematic perspective views showing a method of manufacturing a display apparatus according to an embodiment.

Figure 2:
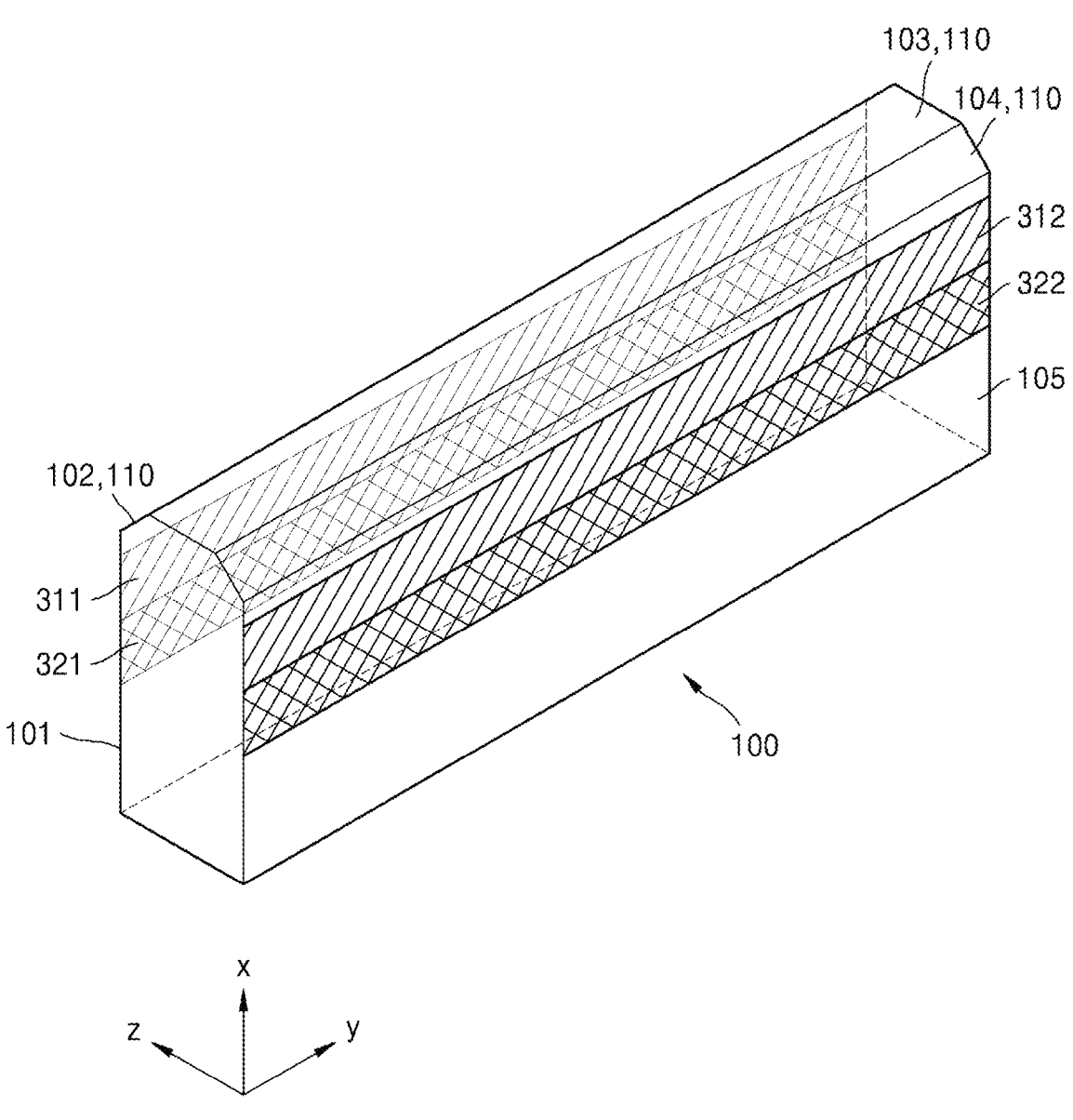
FIG. 2 is a schematic perspective view for describing an operation of attaching a removable film, among operations included in a method of manufacturing a display apparatus, according to an embodiment.

As illustrated in FIG. 2, the substrate 100 includes the upper surface 101, the lower surface 105 and the side surface 110, and the side surface 110 of the substrate 100 may include the first chamfered surface 102 adjacent to the upper surface 101, the second chamfered surface 104 adjacent to the lower surface 105, and the center surface 103 between the first and second chamfered surfaces 102 and 104. If the side surface 110 of the substrate 100 does not include the first chamfered surface 102 and the second chamfered surface 104, a sharp, rectangular edge is formed as the side surface 110 meets the upper surface 101 or the lower surface 105. In this case, when forming an organic film pattern or a metal layer along the upper surface 101, the side surface 110, and the lower surface 105 of the substrate 100, the organic film pattern or the metal layer may be disconnected at the edge, or an organic film pattern or a metal layer having a desired thickness may not be formed.

In an embodiment of the display apparatus 1, the side surface 110 of the substrate 100 includes the first chamfered surface 102 that is adjacent to the upper surface 101 and the second chamfered surface 104 that is adjacent to the lower surface 105, and thus, no sharp, rectangular edges are formed at portions where the side surface 110 meets the upper surface 101 or the lower surface 105. Accordingly, when forming an organic film pattern 500 (refer to FIG. 5) or a metal layer 600 (refer to FIG. 6) along the upper surface 101, the side surface 110, and the lower surface 105 of the substrate 100, the organic film pattern 500 or the metal layer 600 formed along the upper surface 101, the side surface 110, and the lower surface 105 of the substrate 100 are not disconnected, and the organic film pattern 500 or the metal layer 600 that is continuously connected may be formed.

In an embodiment, the side surface 110 of the substrate 100 may have no angled edge between the upper surface 101 and the first chamfered surface 102, and no angled edge between the lower surface 105 and the second chamfered surface 104. In an embodiment, rounded edges may be formed between the center surface 103 and the first chamfered surface 102 and between the center surface 103 and the second chamfered surface 104.

In an embodiment, as illustrated in FIG. 2, removable films such as a first film 311 and a second film 312 may be attached to the substrate 100. In such an embodiment, the removable films may be attached to the upper surface 101 and the lower surface 105 of the substrate 100 adjacent to the side surface 110 of the substrate 100. When the removable films are later removed from the substrate 100, a portion of an organic film connected to the removable films may be removed from the substrate 100 together. This will be described in further detail later. As illustrated in FIG. 2, the first film 311 may be attached to the upper surface 101 adjacent to the side surface 110 of the substrate 100, and the second film 312 may be attached to the lower surface 105 of the substrate 100. In an embodiment, for example, the first film 311 and the second film 312 may be physically removable films. In an embodiment, the first film 311 may include an adhesive member, and the second film 312 may include an adhesive member.

In such an embodiment, removable masking films such as a first masking film 321 and a second masking film 322 may be attached to the upper surface 101 and the lower surface 105 close to the side surface 110 of the substrate 100. When depositing the metal layer 600, the removable masking films may prevent the metal layer 600 from being deposited on the transistor layer of the upper surface 101 and the driver of the lower surface 105. As illustrated in FIG. 2, the first masking film 321 may be attached to the upper surface 101 close to the side surface 110 of the substrate 100, and the second masking film 322 may be attached to the lower surface 105 close to the side surface 110 of the substrate 100. In an embodiment, for example, the first masking film 321 and the second masking film 322 may be physically removable films. In an embodiment, the first masking film 321 may include an adhesive member, and the second masking film 322 may include an adhesive member.

In an embodiment, the first film 311 may be arranged closer to the first chamfered surface 102 than the first masking film 321, and at least a portion of the first film 311 may be attached onto the first masking film 321. After the first masking film 321 is attached first, then the first film 311 may be attached, or after the first film 311 is attached first, then the first masking film 321 may be attached. However, the positional relationship and the attachment order of the first film 311 and the first masking film 321 are not limited thereto. The positional relationship and the attaching order of the second film 312 and the second masking film 322 are the same as or similar to the positional relation and the attaching order of the first film 311 and the first masking film 321, and thus, repetitive detailed description thereof will be omitted.

Figure 3A:
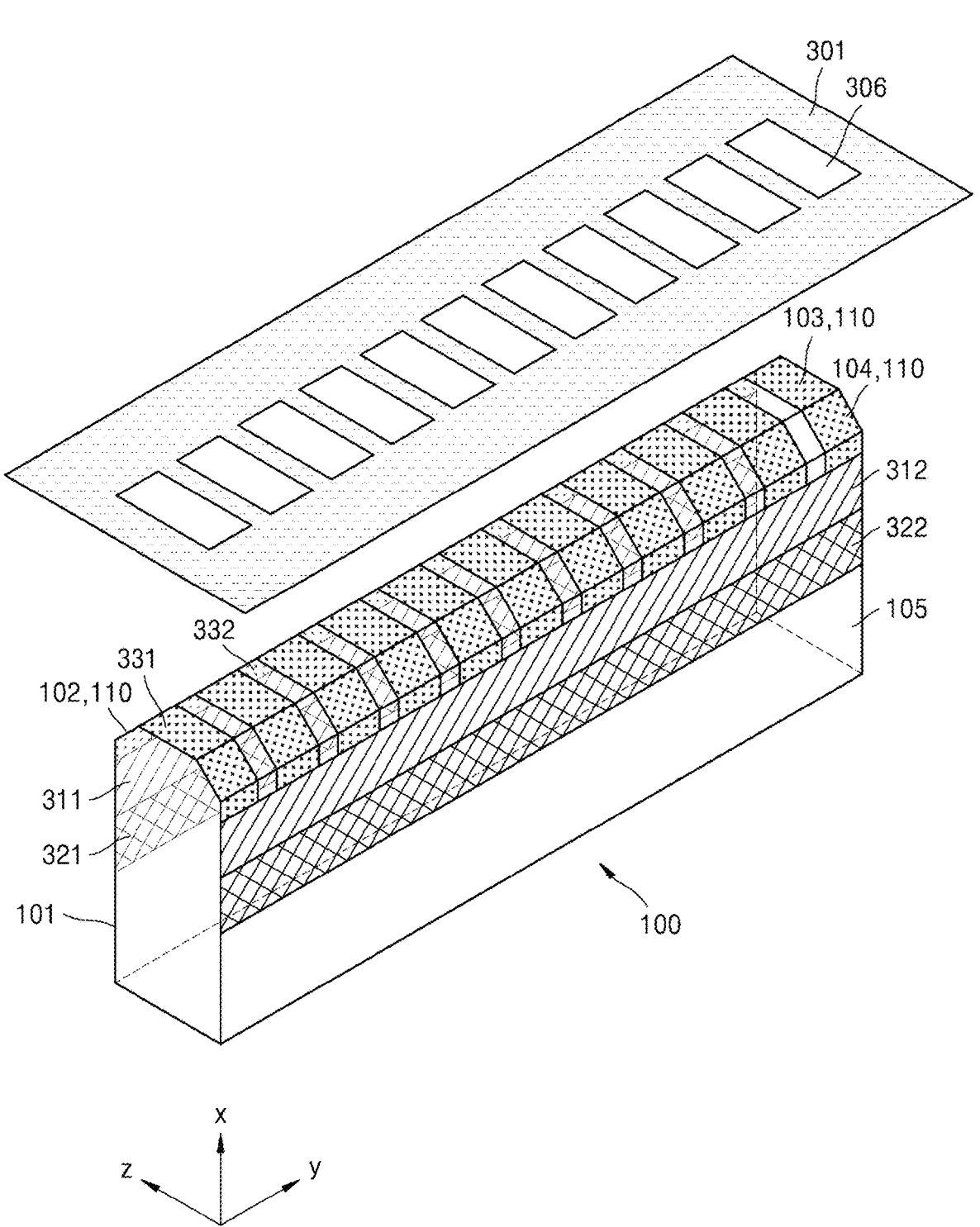
FIGS. 3A and 3B are schematic perspective views for describing an operation of performing plasma treatment by using a mask, among operations included in a method of manufacturing a display apparatus, according to an embodiment.

Next, a first mask 301 and the substrate 100 are arranged as illustrated in FIG. 3A. The side surface 110 of the substrate 100 may include a first region 331 and a second region 332. The first region 331 may be a region to be hydrophilic-treated, and the second region 332 may be between first regions 331.

The first mask 301, through which a first opening 306 is defined, is arranged on the side surface 110 of the substrate 100 in a way such that the first opening 306 overlaps the first region 331. The substrate 100 includes an alignment key, and the alignment key of the substrate 100 may be arranged on the side surface 110 of the substrate 100. The first mask 301 may include an alignment key corresponding to the alignment key of the substrate 100. The first mask 301 may be aligned with the substrate 100 by using the alignment key of the substrate 100 and the alignment key of the first mask 301. Accordingly, the first mask 301 may be arranged on the side surface 110 of the substrate 100 such that the first opening 306 overlaps the first region 331.

Next, plasma generated from a hydrophilic gas may be discharged to the first region 331 of the side surface 110 of the substrate 100 through the first opening 306 of the first mask 301 to thereby perform hydrophilic treatment on the first region 331.

In an embodiment, for example, the hydrophilic gas may include oxygen (02) gas, but the type of the hydrophilic gas is not limited thereto. As illustrated in FIG. 3A, a shape of the first opening 306 is the same as a shape of the first region 331, and the first opening 306 is arranged to overlap the first region 331, and thus, plasma generated from the hydrophilic gas may be selectively discharged only to the first region 331 through the first opening 306.

Figure 3B:
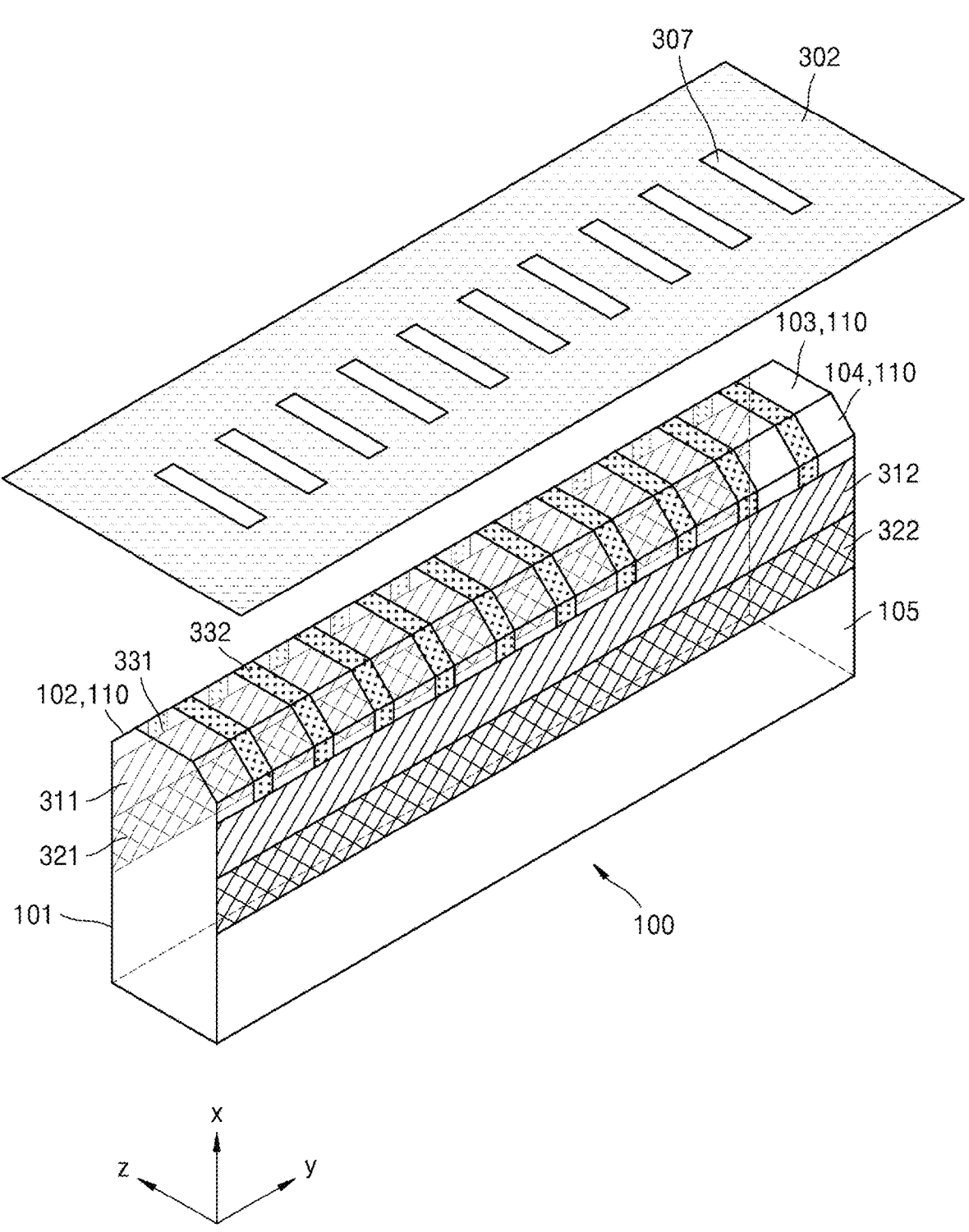

Alternatively, a second mask 302 and the substrate 100 are arranged as illustrated in FIG. 3B. The second mask 302 through which a second opening 307 is defined, is arranged on the side surface 110 of the substrate 100 such that the second opening 307 overlaps the second region 332. A method in which the second mask 302 is arranged on the side surface 110 of the substrate 100 such that the second opening 307 overlaps the second region 332 is similar to the method in which the first mask 301 is arranged on the side surface 110 of the substrate 100 such that the first opening 306 overlaps the first region 331, and thus, repetitive detailed description thereof will be omitted.

The second region 332 may be hydrophobic-treated, and the hydrophobic treatment may be plasma treatment. In an embodiment, for example, hydrophobic plasma treatment may include applying a high frequency electric field to carbon tetrafluoride ($CF_4$) gas to generate plasma, and irradiating, with the plasma, the second region 332 of the side surface 110 of the substrate 100, to thereby perform hydrophobic treatment on the second region 332 through a chemical reaction.

According to an embodiment of the method of manufacturing the display apparatus 1, the second region 332 may be hydrophobic-treated by arranging the second mask 302 on the side surface 110 of the substrate 100 in a way such that the second opening 307 overlaps the second region 332 and by discharging plasma generated from a hydrophobic gas through the second opening 307. In an embodiment, for example, the hydrophobic gas may include carbon tetrafluoride ($CF_4$) gas, but the type of the hydrophobic gas is not limited thereto. As illustrated in FIG. 3B, a shape of the second opening 307 is the same as a shape of the second region 332, and the second opening 307 is arranged to overlap the second region 332, and thus, plasma generated from the hydrophobic gas may be selectively discharged only to the second region 332 through the second opening 307.

In an embodiment, as described above with reference to FIGS. 3A and 3B, hydrophilic treatment and hydrophobic treatment may be performed using a mask, but the disclosure is not limited thereto.

Figure 4A:
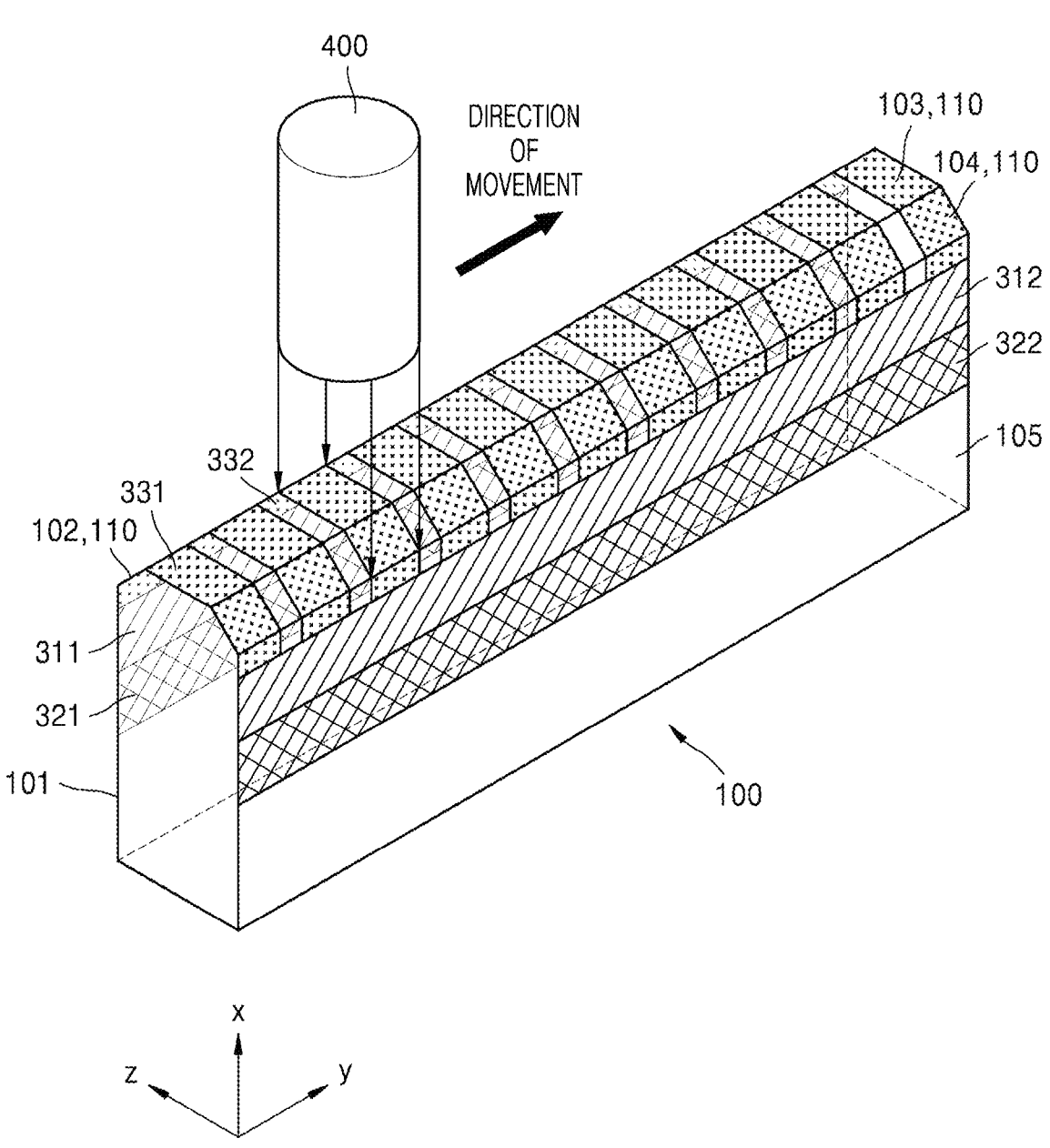
FIGS. 4A and 4B are schematic perspective views for describing an operation of performing plasma treatment by using a discharge outlet, among operations included in a method of manufacturing a display apparatus, according to an embodiment.

In an alternative embodiment, for example, as illustrated in FIG. 4A, without using the first mask 301, hydrophilic treatment may be performed on the first region 331 by moving a nozzle 400, through which plasma generated from a hydrophilic gas may be discharged, from one end of the side surface 110 to the other end thereof, and discharging, to the first region 331, the plasma generated from the hydrophilic gas through the nozzle 400. In such an embodiment, for example, the hydrophilic gas may include oxygen (02) gas, but the type of the hydrophilic gas is not limited thereto. In an embodiment, as illustrated in FIG. 4A, the nozzle 400 may be moved in a y-axis direction. When the nozzle 400 is moved above the first region 331, the nozzle 400 may discharge plasma generated from the hydrophilic gas, to the first region 331, and when the nozzle 400 is moved above the second region 332, the nozzle 400 may not discharge, to the second region 332, plasma generated from the hydrophilic gas.

Figure 4B:
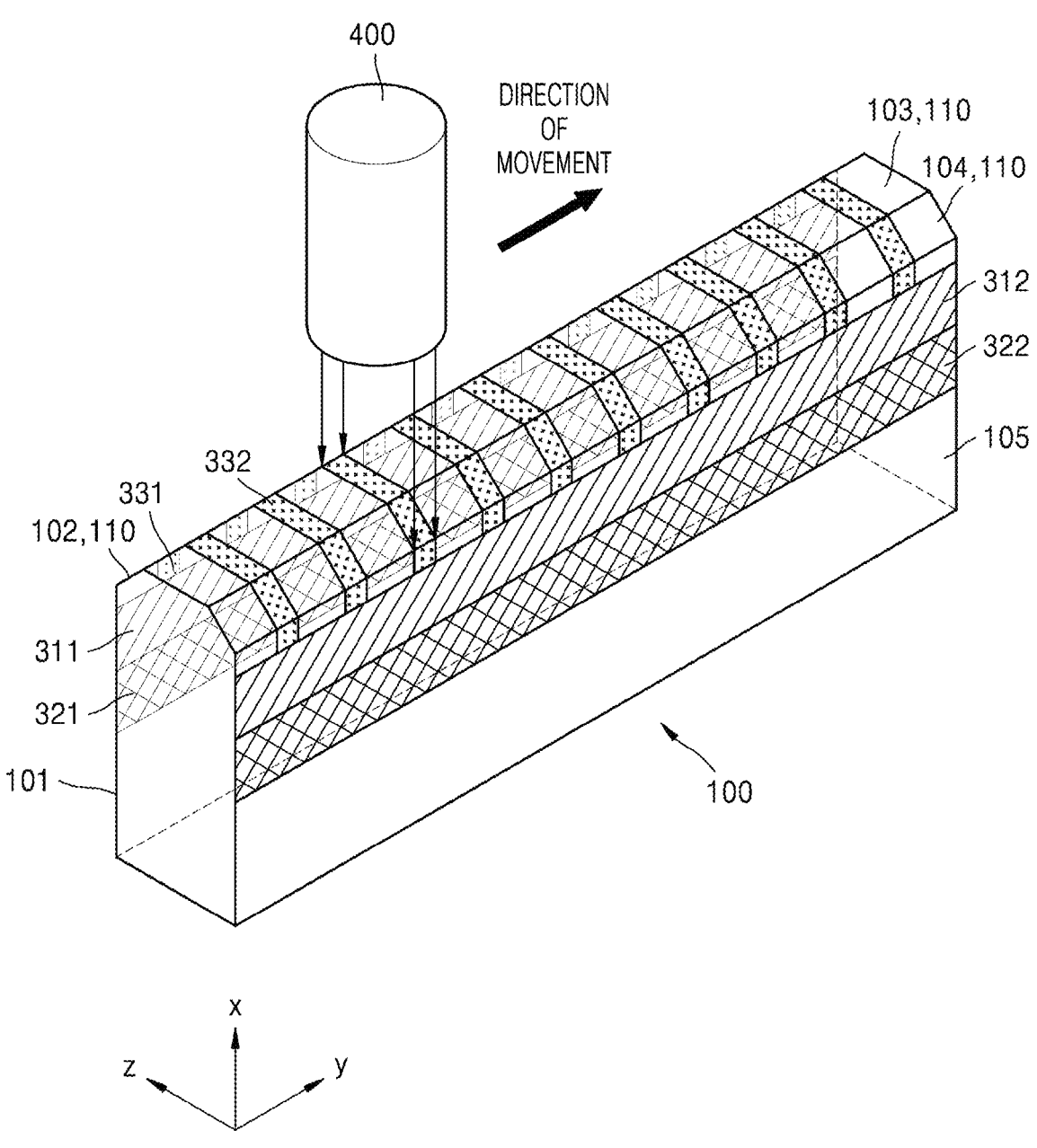

In another alternative embodiment, as illustrated in FIG. 4B, by discharging, to the second region 332, plasma generated from the hydrophobic gas, through the nozzle 400, while moving the nozzle 400 from one end of the side surface 110 to the other end thereof, hydrophobic treatment may be performed on the second region 332. In such an embodiment, for example, the hydrophobic gas may include carbon tetrafluoride ($CF_4$) gas, but the type of the hydrophobic gas is not limited thereto. In an embodiment, as illustrated in FIG. 4B, the nozzle 400 may be moved in the y-axis direction. When the nozzle 400 is moved above the second region 332, the nozzle 400 may discharge plasma generated from the hydrophobic gas, to the second region 332, and when the nozzle 400 is moved above the first region 331, the nozzle 400 may not discharge, to the first region 331, plasma generated from the hydrophobic gas.

In such an embodiment where only the first region 331 is hydrophilic-treated or only the second region 332 is hydrophobic-treated, hydrophilicity of the first region 331 may be higher than hydrophilicity of the second region 332. Accordingly, as will be described later, when the material for forming an organic film is provided or positioned on the side surface 110 of the substrate 100, it may be thermodynamically more stable when a material for forming an organic film is positioned on the first region 331 than when the material for forming an organic film is positioned on the second region 332.

In an embodiment, as described above, the hydrophilic treatment of the first region 331 of the substrate 100 or the hydrophobic treatment of the second region 332 of the substrate 100 are performed, but the method of performing plasma treatment on the side surface 110 of the substrate 100 is not limited thereto. In an alternative embodiment, for example, after hydrophilic-treating the first region 331, the second region 332 may be hydrophobic-treated. In such an embodiment, the organic film pattern 500 may be formed after the second region 332 is hydrophobic-treated. Alternatively, after hydrophobic-treating the second region 332, the first region 331 may be hydrophilic-treated. In such an embodiment, the organic film pattern 500 may be formed after the first region 331 is hydrophilic-treated. In an embodiment where the first region 331 is hydrophilic-treated and the second region 332 is hydrophobic-treated, a difference between hydrophilicity of the first region 331 and hydrophilicity of the second region 332 may be larger than when only the first region 331 is hydrophilic-treated or only the second region 332 is hydrophobic-treated. Accordingly, when the material for forming an organic film is positioned on the side surface 110 of the substrate 100 as described below, it may be thermodynamically far more stable when the material for forming an organic film is positioned on the first region 331 than when the material for forming an organic film is on the second region 332.

Figure 5:
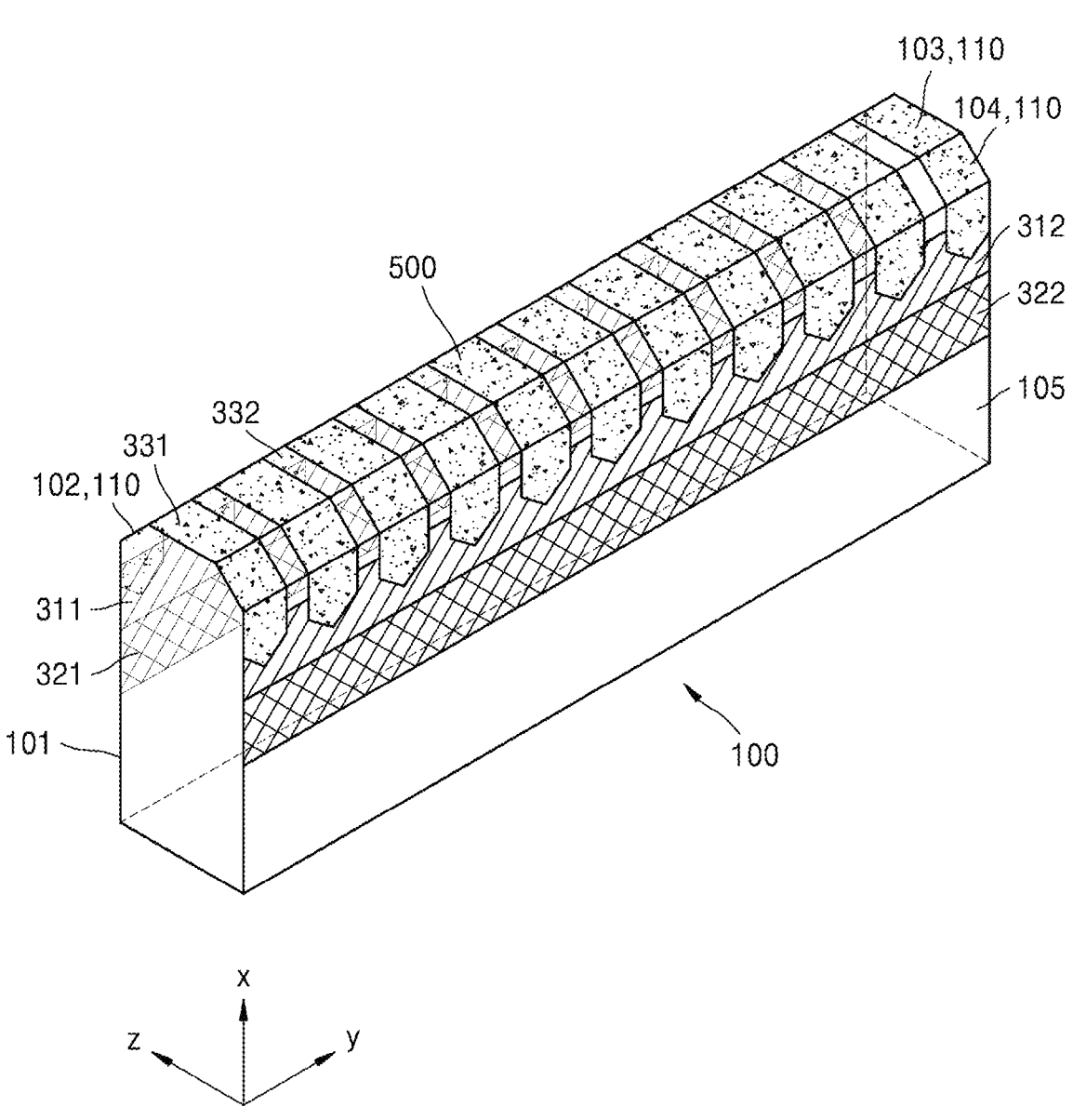
FIG. 5 is a schematic perspective view for describing an operation of forming an organic film pattern, among operations included in a method of manufacturing a display apparatus, according to an embodiment.

Thereafter, the organic film pattern 500 is provided or formed on the first region 331 of the substrate 100 as illustrated in FIG. 5. As illustrated in FIG. 5, the organic film pattern 500 may include a line having one end arranged on the first film 311 and the other end arranged on the second film 312. The organic film pattern 500 may include an organic material such as polyimide or hexamethyldisiloxane ("HMDSO").

In an embodiment, the organic film pattern 500 may be formed by inkjet-printing a material for forming an organic film. In a case where the organic film pattern 500 is formed by inkjet-printing a material for forming an organic film, after the material for forming the organic film is discharged to the substrate 100, the material may spread on the substrate 100 in an unintended direction. Accordingly, the organic film pattern 500 may have an undesirable shape. That is, when forming a plurality of lines that are apart from each other through inkjet printing, as the material for forming an organic film, the material being discharged to the substrate 100, spreads toward adjacent lines, the plurality of lines may not be apart from each other but may be connected to each other.

In an embodiment of the method of manufacturing the display apparatus 1, as described above, the first region 331 is hydrophilic-treated or the second region 332 is hydropho-bic-treated, such that the hydrophilicity of the first region 331 may be higher than the hydrophilicity of the second region 332. Thus, it may be thermodynamically more stable when a material for forming an organic film is positioned on the first region 331 than when the material for forming an organic film is positioned on the second region 332. Accordingly, the material for forming an organic film, the material being discharged to the first region 331, may not spread toward the second region 332 but only on the first region 331, and thus, a plurality of lines that are apart from each other may be effectively provided or formed.

Figure 6:
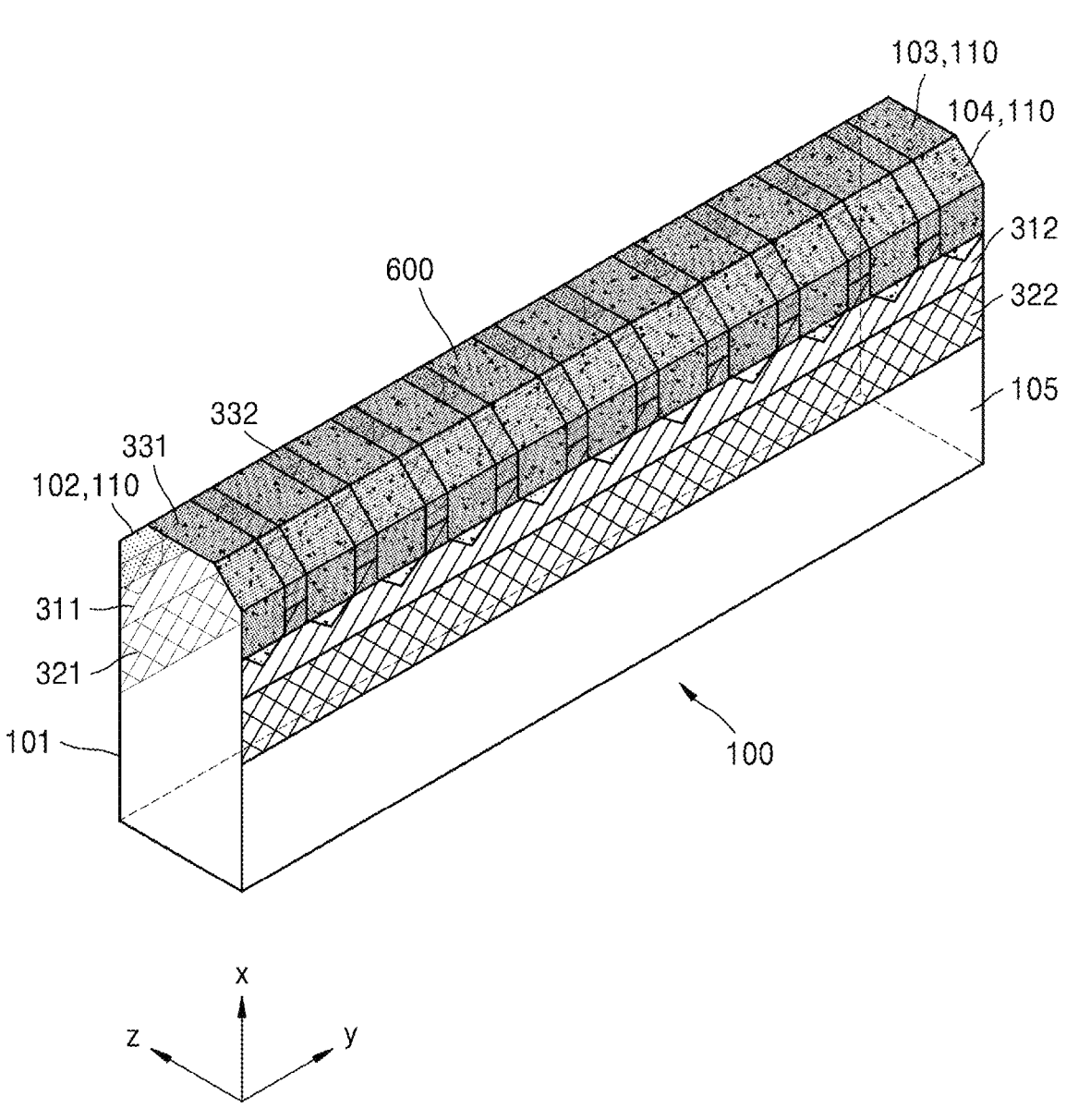
FIG. 6 is a schematic perspective view for describing an operation of forming a metal layer, among operations included in a method of manufacturing a display apparatus, according to an embodiment.

After forming the organic film pattern 500, as illustrated in FIG. 6, the metal layer 600 is provided or formed on the first region 331 and the second region 332. The metal layer 600 may cover both the organic film pattern 500 formed on the first region 331 and the second region 332 of the side surface 110 of the substrate 100, and the metal layer 600 formed on the first region 331 and the second region 332 may be in a continuously connected shape. Formation of a metal layer on the transistor layer of the upper surface 101 and the driver of the lower surface 105 may be effectively prevented by the first masking film 321 and the second masking film 322. The metal layer 600 as described above may include various conductive materials and have various layered structures. In an embodiment, for example, the metal layer 600 may include a Mo layer and an Al layer, or may include a Ti layer, an Al layer, and/or a Cu layer.

Figure 7:
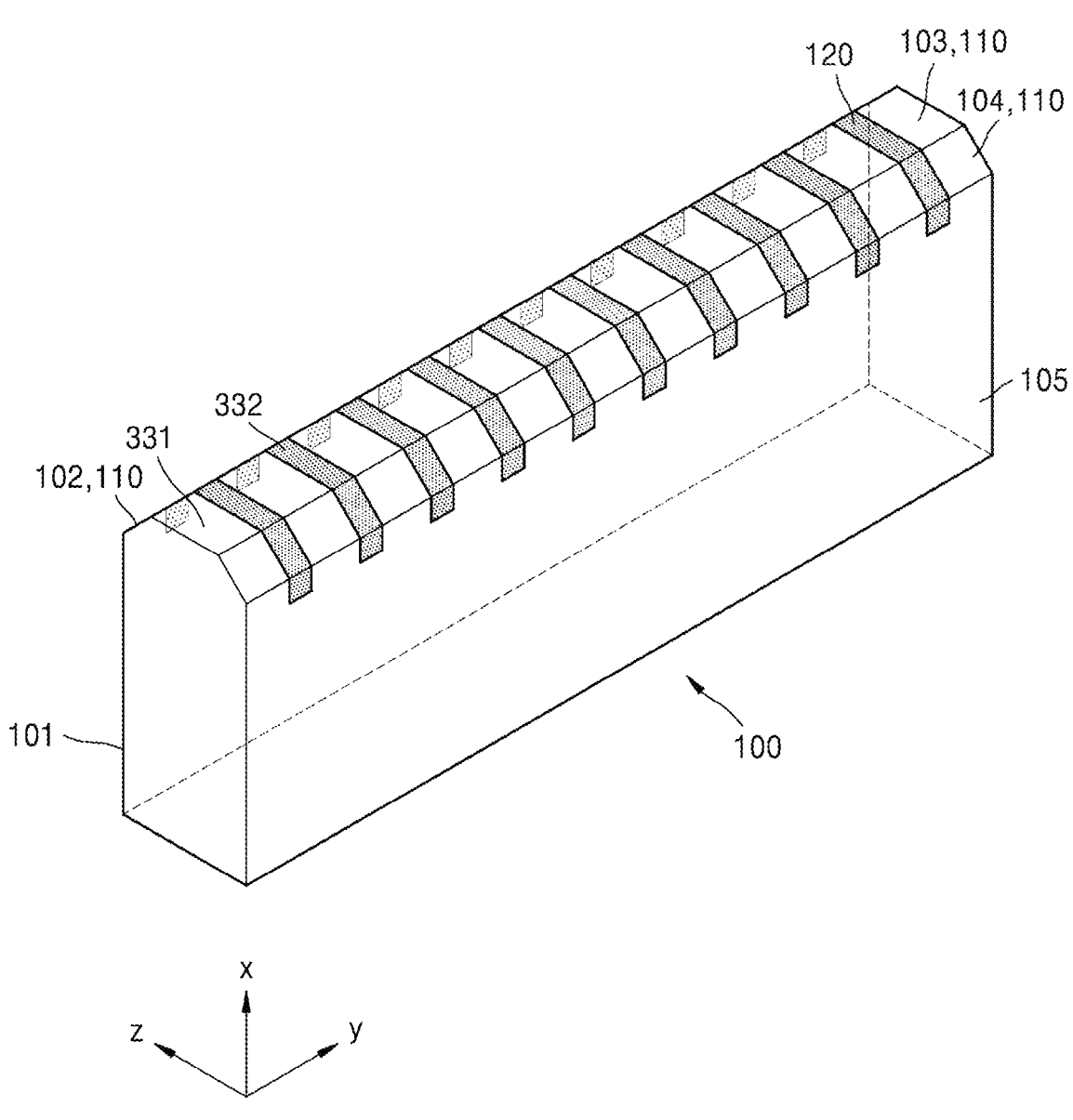
FIG. 7 is a schematic perspective view for describing an operation of forming a connection wire, among operations included in a method of manufacturing a display apparatus, according to an embodiment.

After forming the metal layer 600 as described above, the first film 311 and the second film 312 and the organic film pattern 500 may be removed so that portions of the metal layer 600 on the organic film pattern 500, the first film 311 and the second film 312 are removed together, thereby forming the connection wire 120 as illustrated in FIG. 7. As the portions of the organic film pattern 500 are located on the first film 311 or the second film 312, when the first film 311 or the second film 312 is removed, the organic film pattern 500 may also be removed. When the organic film pattern 500 is removed, the portions of the metal layer 600 on the organic film pattern 500 may also be removed. Accordingly, only portions of the metal layer 600 on the second region 332 remain and exist, except for the portions of the metal layer 600 on the organic film pattern 500, such that the connection wire 120 may be formed.

In an embodiment, as described above, the connection wire 120 may be formed by removing the organic film pattern 500 and portions of the metal layer 600 on the first region 331. As illustrated in FIG. 7, the connection wire 120 may be continuously connected along the upper surface 101, the side surface 110, and the lower surface 105 of the substrate 100. One end of the connection wire 120 may be electrically connected to the transistor layer of the upper surface 101, and the other end of the connection wire 120 may be electrically connected to the driver of the lower surface 105. Accordingly, a control signal generated by the driver may be transmitted to the transistor layer through the connection wire 120.

In an embodiment of the method of manufacturing the display apparatus 1, the connection wire 120 may be formed by detaching the first film 311 or the second film 312 from the substrate 100 and thus removing the organic film pattern 500 and the portions of the metal layer 600 on the first region 331. In an embodiment, as one end of the organic film pattern 500 is arranged on the first film 311 or the second film 312, the organic film pattern 500 may be connected to the first film 311 or the second film 312. In such an embodiment, the organic film pattern 500 may be removed when the first film 311 or the second film 312 is removed. In such an embodiment, along with the removal of the organic film pattern 500, the portions of the metal layer 600 on the organic film pattern 500 may also be removed.

In an embodiment, for example, one end of the organic film pattern 500 is arranged on the first film 311, and the other end of the organic film pattern 500 is arranged on the second film 312, such that the organic film pattern 500 may be connected to both the first film 311 and the second film 312. Accordingly, by detaching the first film 311 and the second film 312 together from the substrate 100, the organic film pattern 500 and the portions of the metal layer 600 on the first region 331 may be easily removed.

Generally, a chemical process such as etching may be used to remove an organic film pattern. However, according to an embodiment of the method of manufacturing the display apparatus 1, the organic film pattern 500 may be physically removed using the removable films such as the first film 311 and the second film 312. Accordingly, a process for manufacturing the display apparatus 1 may be simplified, and the manufacturing cost may also be reduced.

According to an embodiment of the method of manufac-turing the display apparatus 1, the organic film pattern 500 and the portions of the metal layer 600 on the first region 331 may be removed after raising a temperature of the substrate 100 to a set temperature or above. The higher the tempera-ture of the substrate 100, the lower may be a bonding force between the organic film pattern 500 and the substrate 100. Accordingly, in such an embodiment, the organic film pat-tern 500 and the portions of the metal layer 600 on the first region 331 may be easily removed from the substrate 100.

In an embodiment, as described above, when the organic film pattern 500 and the portions of the metal layer 600 on the first region 331 are removed from the substrate 100, only portions of the metal layer 600 on the second region 332 remain and exist on the side surface 110 of the substrate 100, such that the connection wire 120 is formed by the portions of the metal layer 600 on the second region 332.

In an alternative embodiment, the connection wire 120 included in the display apparatus 1 may have a zigzag shape when viewed from a direction perpendicular to the side surface 110 (x-axis direction). Hereinafter, an embodiment of a method of manufacturing the display apparatus 1 including the connection wire 120 having a zigzag shape will be described with reference to FIGS. 8 to 11.

FIGS. 8 to 11 are schematic perspective views showing a method of manufacturing a display apparatus according to an alternative embodiment.

The method of manufacturing the display apparatus 1 including the connection wire 120 having a zigzag shape is substantially the same as the method described above with reference to FIGS. 2 to 7, and thus, for convenience of description, any repetitive detailed description of the same or like elements as those above with reference to FIGS. 2 to 7 will hereinafter be omitted or simplified.

Figure 8:
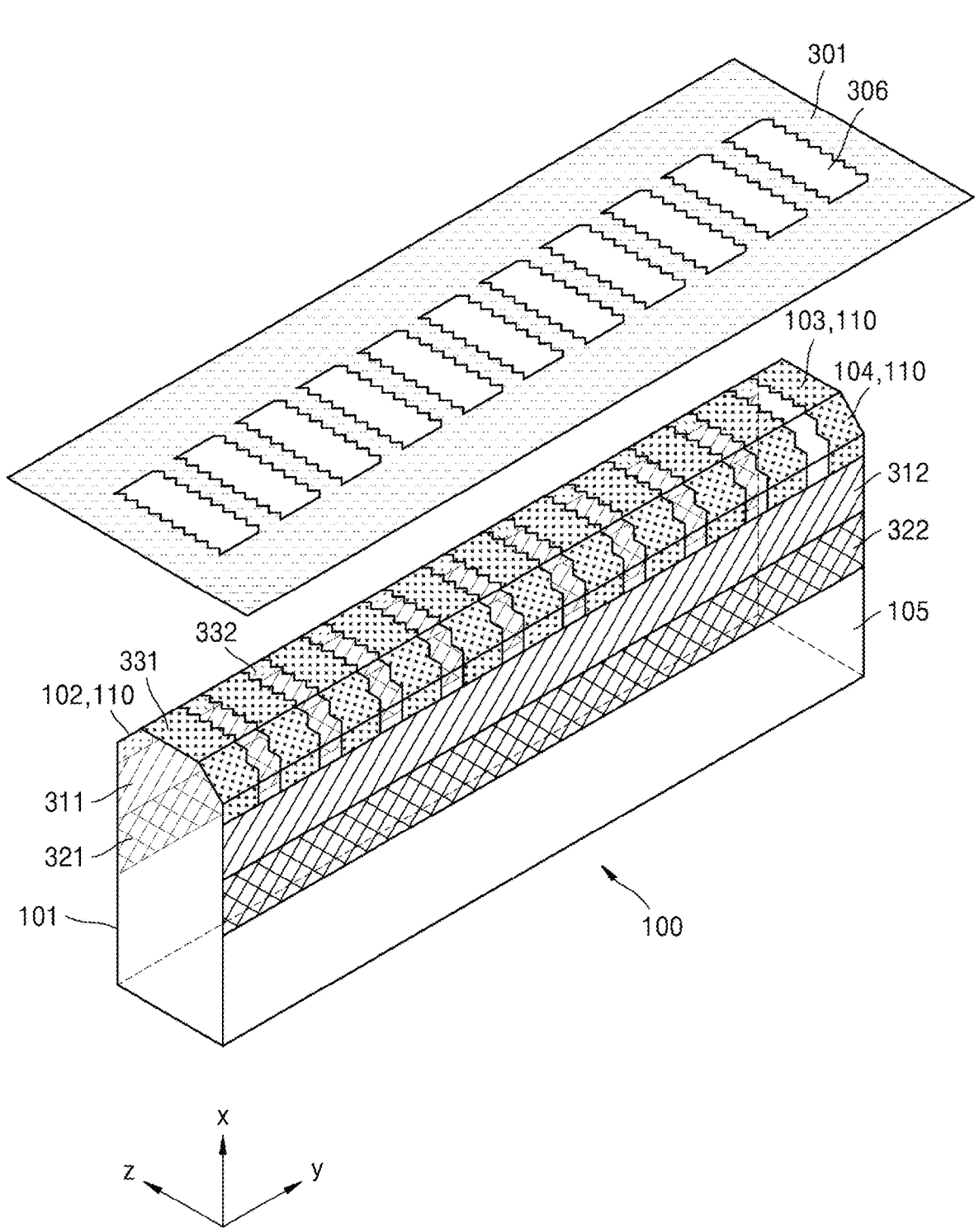
FIG. 8 is a schematic perspective view for describing an operation of performing hydrophilic treatment, among operations included in a method of manufacturing a display apparatus, according to an embodiment.

The first mask 301 and the substrate 100 are arranged as illustrated in FIG. 8. The side surface 110 of the substrate 100 may include the first region 331 and the second region 332. The first regions 331 may be regions to be hydrophilic-treated, and the second regions 332 may be between the first regions 331. The first region 331 may have a zigzag shape, and the second region 332 between the first regions 331 may also have a zigzag shape. The first opening 306 may be defined through the first mask 301. The shape of the first opening 306 is a zigzag shape, and may be the same as the shape of the first region 331.

The first mask 301 is arranged on the side surface 110 of the substrate 100 in a way such that the first opening 306 overlaps the first region 331. Next, plasma generated from a hydrophilic gas may be discharged to the first region 331 of the side surface 110 of the substrate 100, through the first opening 306 of the first mask 301, to thereby perform hydrophilic treatment on the first region 331. In an embodiment, for example, the hydrophilic gas may include oxygen ($O_2$) gas, but the type of the hydrophilic gas is not limited thereto. The first opening 306 is arranged to overlap the first region 331, and thus, plasma generated from the hydrophilic gas may be selectively discharged to the first region 331 through the first opening 306. Accordingly, according to an embodiment of the method of manufacturing the display apparatus 1, hydrophilic treatment may be performed according to the shape of the first region 331, that is, the zigzag shape.

Figure 9:
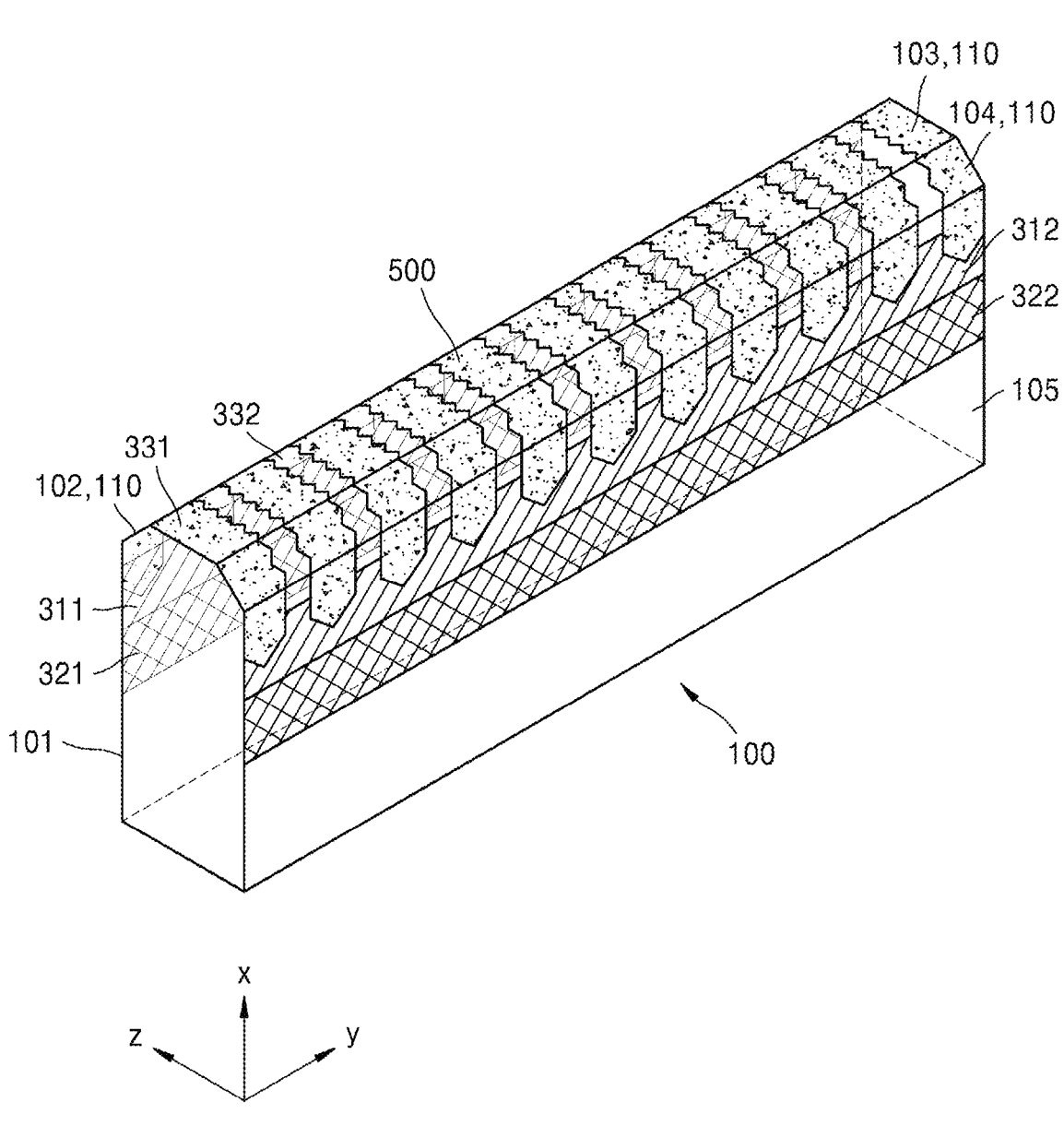
FIG. 9 is a schematic perspective view for describing an operation of forming an organic film pattern, among operations included in a method of manufacturing a display apparatus, according to an embodiment.

Thereafter, the organic film pattern 500 is provided or formed on the first region 331 as illustrated in FIG. 9. As illustrated in FIG. 9, the organic film pattern 500 may have one end arranged on the first film 311 and the other end arranged on the second film 312 and have a zigzag shape. As only the zigzag shape of the first region 331 is selectively hydrophilic-treated, a material for forming an organic film, the material being discharged to the first region 331, may not spread toward the second region 332. Thus, the organic film pattern 500 may have a zigzag shape.

Figure 10:
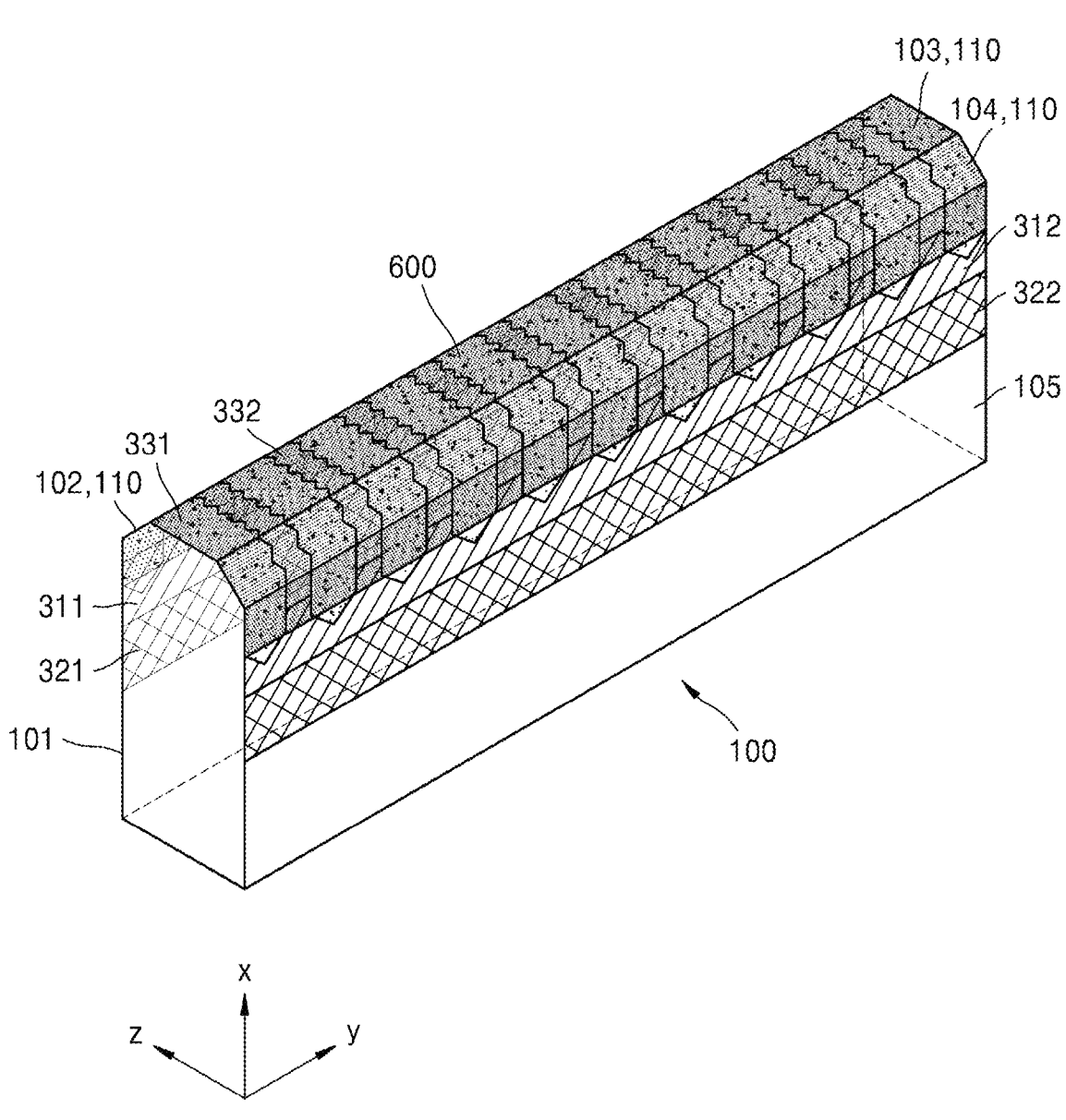
FIG. 10 is a schematic perspective view for describing an operation of forming a metal layer, among operations included in a method of manufacturing a display apparatus, according to an embodiment.

After forming the organic film pattern 500 having a zigzag shape, as illustrated in FIG. 10, the metal layer 600 is provided or formed on the first region 331 and the second region 332. The metal layer 600 may cover both the organic film pattern 500 formed on the first region 331 and the second region 332 on the side surface 110 of the substrate 100, and the metal layer 600 formed on the first region 331 and the second region 332 may be in a continuously connected shape. Formation of a metal layer on the transistor layer of the upper surface 101 and the driver of the lower surface 105 may be prevented by the first masking film 321 and the second masking film 322.

Figure 11:
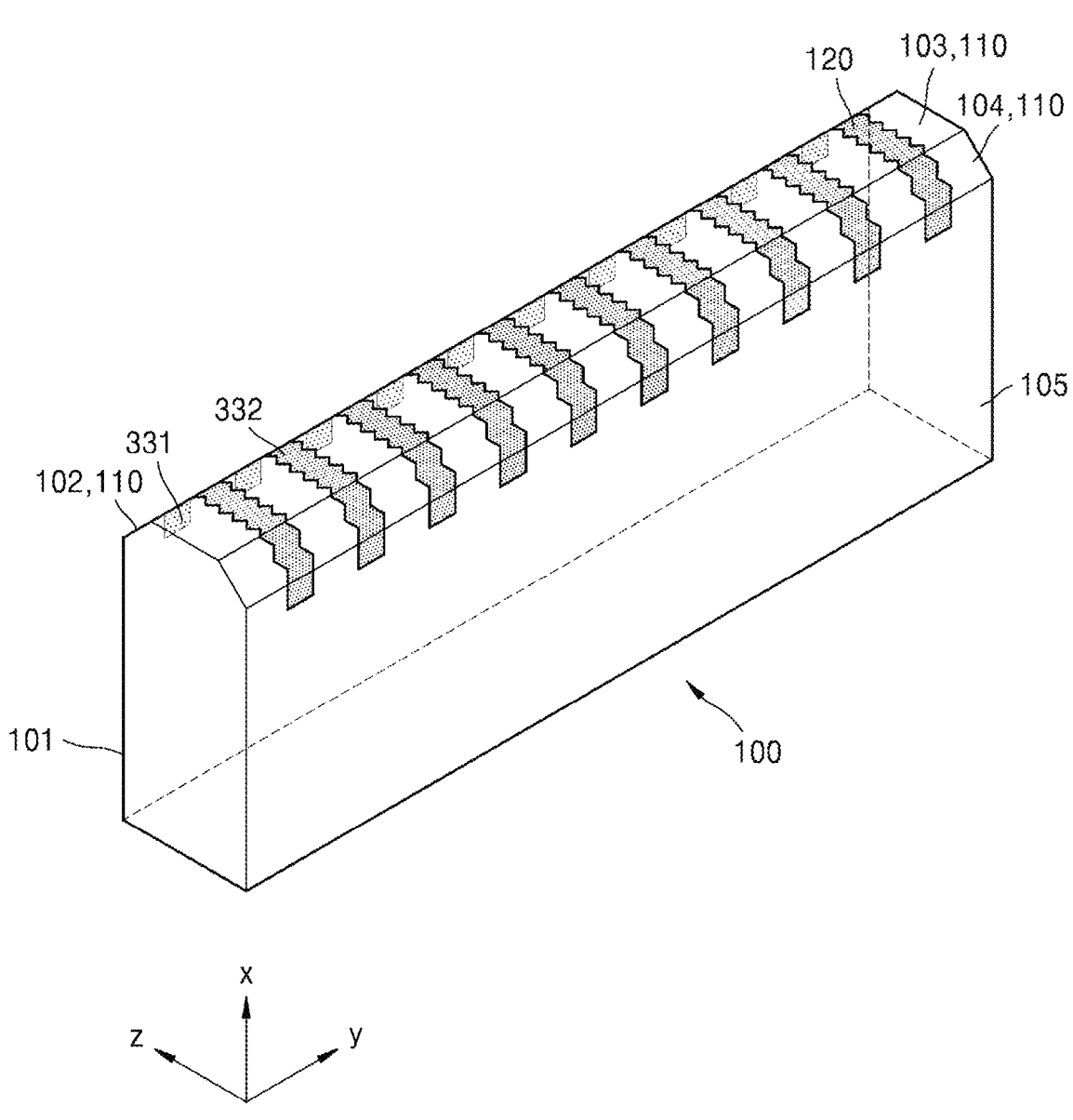
FIG. 11 is a schematic perspective view for describing an operation of forming a connection wire, among operations included in a method of manufacturing a display apparatus, according to an embodiment.

After forming the metal layer 600 as described above, the first film 311 and the second film 312 and the organic film pattern 500 may be removed to thereby also remove portions of the metal layer 600 on the organic film pattern 500 and form the connection wire 120 as illustrated in FIG. 11.

By detaching, from the substrate 100, the first film 311 attached to the upper surface 101 of the substrate 100 adjacent to the side surface 110 or the second film 312 attached to the lower surface 105 adjacent to the side surface 110 of the substrate 100, the organic film pattern 500 and the portions of the metal layer 600 on the first region 331 may be removed. Also, by detaching the first film 311 and the second film 312 from the substrate 100 together, the organic film pattern 500 and the portions of the metal layer 600 on the first region 331 may be removed. Accordingly, only portions of the metal layer 600 on the second region 332 remain and exist on the side surface 110 of the substrate 100. That is, the connection wire 120 having a zigzag shape as illustrated in FIG. 11 is formed by the portions of the metal layer 600 on the second region 332.

In an embodiment where the first region 331 and the second region 332 have a zigzag shape, the portions of the metal layer 600 on the first region 331 and the portions of the metal layer 600 on the second region 332 may be separated from each other along a zigzag line which is a boundary line between the first region 331 and the second region 332. In such an embodiment, impact applied to the metal layer 600 may be distributed, and the portions of the metal layer 600 on the first region 331 and the portions of the metal layer 600 on the second region 332 may be easily separated from each other.

The connection wire 120 may be formed by depositing or coating metal particles on the substrate 100 in a direction perpendicular to the side surface 110 of the substrate 100 (x-axis direction), that is, in a direction substantially parallel to the upper surface 101 and the lower surface 105 of the substrate 100. Accordingly, the bonding force between the substrate 100 and the portions of the connection wire 120 arranged on the upper surface 101 and the lower surface 105 may be relatively low. In such an embodiment, the bonding force between the substrate 100 and portions of the connection wire 120 on the first chamfered surface 102 and the second chamfered surface 104 may be lower than a bonding force between the substrate 100 and a portion of the connection wire 120 on the center surface 103.

In an embodiment, the display apparatus 1 may include the connection wire 120 having a zigzag shape when viewed from the direction perpendicular to the side surface 110 (x-axis direction). Accordingly, as the connection wire 120 has a zigzag shape, the surface area of the connection wire 120 may increase to increase the bonding force between connection wire 120 and the substrate 100. Accordingly, exfoliation of a portion of the connection wire 120 from the substrate 100 or the like in subsequent processes after the formation of the connection wire 120 may be effectively prevented.

FIGS. 12 and 13 are flowcharts of a method of manufacturing the display apparatus 1, according to an embodiment. In detail, FIG. 12 is a flowchart showing an embodiment of the method of manufacturing the display apparatus 1, by using hydrophilic treatment. Referring to FIGS. 12 and 13, an embodiment of the method of manufacturing the display apparatus 1 includes the same operations as those described above with reference to FIGS. 2 to 11. According to an embodiment of the method of manufacturing the display apparatus 1 as described above, the display apparatus 1 as described above with reference to FIG. 1 may be manufactured. Hereinafter, for convenience of description, any repetitive detailed description of the same or like elements as those described above with reference to FIGS. 1 to 11 may be omitted or simplified.

In operation S1210, the first film 311 may be attached to the upper surface 101 adjacent to the side surface 110 of the substrate 100 or the second film 312 may be attached to the lower surface 105 adjacent to the side surface 110 of the substrate 100. In an embodiment, for example, the first film 311 and the second film 312 may be physically removable films. In an embodiment, the first film 311 may include an adhesive member, and the second film 312 may include an adhesive member. In an embodiment, the removable masking films 321 and 322 may be attached to the upper surface 101 and the lower surface 105 adjacent to the side surface 110 of the substrate 100. In an embodiment, for example, the first masking film 321 and the second masking film 322 may be physically removable films. In an embodiment, the first masking film 321 may include an adhesive member, and the second masking film 322 may include an adhesive member.

In operation S1220, the first region 331 among the side surface 110 of the substrate 100 including the first region 331 and the second region 332 may be hydrophilic-treated. In an embodiment, for example, the first region 331 may be hydrophilic-treated by using the first mask 301 or the nozzle 400, and the hydrophilic treatment may include plasma treatment. In an embodiment, for example, hydrophilic plasma treatment may include applying a high frequency electric field to oxygen (02) gas to generate plasma, and irradiating, with the plasma, the first region 331 of the side surface 110 of the substrate 100, to thereby perform hydrophilic treatment on the first region 331 through a chemical reaction.

In an embodiment where the first region 331 is hydrophilic-treated using the first mask 301, the first mask 301, through which the first opening 306 is defined, may be arranged on the side surface 110 of the substrate 100 in a way such that the first opening 306 overlaps the first region 331, and then plasma generated from a hydrophilic gas may be discharged to the first region 331 through the first opening 306.

In an embodiment where the first region 331 is hydrophilic-treated using the nozzle 400, as the nozzle 400 is moved from one end of the side surface 110 to the other end of the side surface 110, plasma generated from the hydrophilic gas may be discharged to the first region 331. After the first region 331 is hydrophilic-treated, the second region 332 is hydrophobic-treated, and thus, a difference between the hydrophilicity of the first region 331 and the hydrophilicity of the second region 332 may be further increased.

In an embodiment where the first region 331 has a zigzag shape, the first region 331 may be hydrophilic-treated using the first mask 301 through which the first opening 306 having a zigzag shape is defined. The first opening 306 having a zigzag shape is arranged on the side surface 110 of the substrate 100 to overlap the first region 331, and has the same zigzag as the first region 331, and thus, only the zigzag shape of the first region 331 may be selectively hydrophilic-treated in the side surface 110.

In operation S1230, the organic film pattern 500 may be provided or formed on the first region 331. The organic film pattern 500 may be formed after the hydrophilic treatment, and accordingly, the organic film pattern 500 may be formed only on the first region 331 that is hydrophilic-treated, and the organic film pattern 500 may not be formed on the second region 332 that is not hydrophilic-treated. The organic film pattern 500 may include a line having one end arranged on the first film 311 and the other end arranged on the second film 312.

In an embodiment where the first region 331 has a zigzag shape, one end of the organic film pattern 500 may be arranged on the first film 311, and the other end thereof may be arranged on the second film 312, and the organic film pattern 500 may have a zigzag shape. As only the zigzag shape of the first region 331 is selectively hydrophilic-treated, a material for forming an organic film, the material being discharged to the first region 331, may not spread toward the second region 332. Thus, the organic film pattern 500 may have a zigzag shape.

In operation S1240, the metal layer 600 may be provided or formed on the first region 331 and the second region 332. The metal layer 600 may be formed after forming the organic film pattern 500, and accordingly, the metal layer 600 may cover the organic film pattern 500. The metal layer 600 may cover both the organic film pattern 500 formed on the first region 331, and the second region 332 of the side surface 110 of the substrate 100, and the metal layer 600 formed on the first region 331 and the second region 332 may be in a continuously connected shape.

In operation S1250, the connection wire 120 may be formed by removing the organic film pattern 500 and the portions of the metal layer 600 on the first region 331. In an embodiment, one end of the organic film pattern 500 is arranged on the first film 311 or the second film 312, such that the organic film pattern 500 may be connected to the first film 311 or the second film 312. In such an embodiment, the organic film pattern 500 may also be removed when the first film 311 or the second film 312 is detached. In such an embodiment, along with the removal of the organic film pattern 500, portions of the metal layer 600 on the organic film pattern 500 may also be removed. Accordingly, as only the portions of the metal layer 600 on the second region 332 remain and exist on the side surface 110 of the substrate 100, the connection wire 120 may be formed accordingly.

In an embodiment where one end of the organic film pattern 500 is arranged on the first film 311, and the other end of the organic film pattern 500 is arranged on the second film 312, the organic film pattern 500 and the portions of the metal layer 600 on the first region 331 may be easily removed by detaching the first film 311 and the second film 312 together from the substrate 100.

The organic film pattern 500 and the portions of the metal layer 600 on the first region 331 may also be removed after raising the temperature of the substrate 100 to a preset temperature or above. The higher the temperature of the substrate 100, the lower the bonding force between the organic film pattern 500 and the substrate 100, and thus, in this case, the organic film pattern 500 and the portions of the metal layer 600 on the first region 331 may be easily removed from the substrate 100.

In an embodiment where the first region 331 has a zigzag shape, only the portions of the metal layer 600 on the second region 332 remain and exist on the side surface 110 of the substrate 100. In such an embodiment, the connection wire 120 having a zigzag shape is formed by the portions of the metal layer 600 on the second region 332.

As the first region 331 is hydrophilic-treated, the hydrophilicity of the first region 331 may be higher than the hydrophilicity of the second region 332. Thus, it may be thermodynamically more stable when a material for forming an organic film is positioned on the first region 331 than when the material for forming an organic film is positioned on the second region 332. Accordingly, the material for forming an organic film, the material being discharged to the first region 331, may not spread toward the second region 332, but only on the first region 331, and thus, a plurality of lines that are apart from each other may be formed. Accordingly, when removing the organic film pattern 500 and the portions of the metal layer 600 on the first region 331, which are in a shape of a plurality of lines that are apart from each other, the remaining portions of the metal layer 600 on the second region 332 may also be in a form of a plurality of lines that are apart from each other. Thus, the connection wire 120 may be formed in a desired shape without the occurrence of defects in a manufacturing process.

In detail, FIG. 13 is a flowchart showing an embodiment of the method of manufacturing the display apparatus 1, by using hydrophobicity treatment.

In operation S1310, the first film 311 may be attached to the upper surface 101 adjacent to the side surface 110 of the substrate 100 or the second film 312 may be attached to the lower surface 105 adjacent to the side surface 110 of the substrate 100. In an embodiment, for example, the first film 311 and the second film 312 may be physically removable films. In an embodiment, the removable masking films such as the first masking film 321 and the second masking film 322 may be attached to the upper surface 101 and the lower surface 105 adjacent to the side surface 110 of the substrate 100. In an embodiment, for example, the first masking film 321 and the second masking film 322 may be physically removable films.

In operation S1320, the second region 332 among the side surface 110 of the substrate 100 including the first region 331 and the second region 332 may be hydrophobic-treated. In an embodiment, for example, the second region 332 may be hydrophobic-treated by using the second mask 302 or the nozzle 400, and the hydrophobic treatment may be plasma treatment. In an embodiment, for example, hydrophobic plasma treatment may include applying a high frequency electric field to carbon tetrafluoride ($CF_4$) gas to generate plasma, and irradiating, with the plasma, the second region 332, to thereby perform hydrophobic treatment on the second region 332 through a chemical reaction.

In an embodiment where the second region 332 is hydrophobic-treated using the second mask 302, the second mask 302 with the second opening 307 may be arranged on the side surface 110 of the substrate 100 in a way such that the second opening 307 overlaps the second region 332, and then plasma generated from the hydrophobic gas may be discharged to the second region 332 through the second opening 307.

In an embodiment where the second region 332 is hydrophobic-treated using the nozzle 400, as the nozzle 400 is moved from one end of the side surface 110 to the other end of the side surface 110, plasma generated from the hydrophobic gas may be discharged to the second region 332.

In operation S1330, the organic film pattern 500 may be provided or formed on the first region 331. The organic film pattern 500 may be formed after the hydrophobic treatment, and accordingly, the organic film pattern 500 may be formed only on the first region 331 that is not hydrophobic-treated, and the organic film pattern 500 may not be formed on the second region 332 that is hydrophobic-treated. The organic film pattern 500 may include a line having one end arranged on the first film 311 and the other end arranged on the second film 312.

In operation S1340, the metal layer 600 may be provided or formed on the first region 331 and the second region 332. The metal layer 600 may be formed after forming the organic film pattern 500, and accordingly, the metal layer 600 may cover the organic film pattern 500. The metal layer 600 may cover both the organic film pattern 500 formed on the first region 331, and the second region 332 of the side surface 110 of the substrate 100, and the metal layer 600 formed on the first region 331 and the second region 332 may be in a continuously connected shape.

In operation S1350, the connection wire 120 may be formed by removing the organic film pattern 500 and the portions of the metal layer 600 on the first region 331. In an embodiment, one end of the organic film pattern 500 is arranged on the first film 311 or the second film 312, such that the organic film pattern 500 may be connected to the first film 311 or the second film 312. In such an embodiment, the organic film pattern 500 may also be removed when the first film 311 or the second film 312 is detached. In such an embodiment, along with the removal of the organic film pattern 500, portions of the metal layer 600 on the organic film pattern 500 may also be removed. Accordingly, as only the portions of the metal layer 600 on the second region 332 remain and exist on the side surface 110 of the substrate 100, the connection wire 120 may be formed accordingly.

As the second region 332 is hydrophobic-treated, the hydrophilicity of the first region 331 may be higher than the hydrophilicity of the second region 332. Thus, it may be thermodynamically more stable when a material for forming an organic film is positioned on the first region 331 than when the material for forming an organic film is positioned on the second region 332. Accordingly, the material for forming an organic film, the material being discharged to the first region 331, may not spread toward the second region 332 but only on the first region 331, and thus, a plurality of lines that are apart from each other may be formed. Accordingly, when removing the organic film pattern 500 and the portions of the metal layer 600 on the first region 331, which are in a shape of a plurality of lines that are apart from each other, the remaining portions of the metal layer 600 on the second region 332 may also be in a form of a plurality of lines that are apart from each other. Thus, the connection wire 120 may be formed in a desired shape without the occurrence of defects in a manufacturing process.

According to embodiments of the invention, as described above, a display apparatus, in a manufacturing process of which a defect ratio may be reduced, may be implemented.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A method of manufacturing a display apparatus, the method comprising:

attaching a removable first film to one of an upper surface and a lower surface of a substrate, adjacent to a side surface of the substrate;

hydrophilic-treating a first region of the side surface of the substrate, wherein the side surface includes the first region and a second region;

providing an organic film pattern on the first region after the hydrophilic-treating the first region of the side surface;

providing a metal layer on the first region and the second region after the providing the organic film pattern; and forming a connection wire by removing the organic film pattern and portions of the metal layer on the first region.

2. The method of claim 1, wherein the hydrophilic-treating the first region of the side surface comprises performing a plasma treatment on the first region.

3. The method of claim 1, wherein the hydrophilic-treating the first region of the side surface comprises:

disposing a mask with an opening on the side surface of the substrate in a way such that the opening overlaps the first region; and discharging, to the first region through the opening, plasma generated from a hydrophilic gas.

4. The method of claim 1, wherein the hydrophilic-treating the first region of the side surface comprises, while moving a discharge outlet from one end of the side surface to another end of the side surface, discharging plasma generated from a hydrophilic gas, from the discharge outlet to the first region.

5. The method of claim 1, further comprising:

hydrophobic-treating the second region after the hydrophilic-treating the first region of the side surface and before the providing the organic film pattern.

6. The method of claim 1, further comprising:

attaching a removable second film to the other of the upper surface and the lower surface of the substrate.

7. The method of claim 6, wherein the providing the organic film pattern comprises providing one end of the organic film pattern on the first film and another end of the organic film pattern on the second film.

8. The method of claim 7, wherein the forming the connection wire comprises detaching the first film and the second film from the substrate to remove the organic film pattern and the portions of the metal layer on the first region.

9. The method of claim 7, wherein the forming the connection wire comprises detaching the first film from the substrate to remove the organic film pattern and the portions of the metal layer on the first region.

10. The method of claim 1, wherein the forming the connection wire comprises raising a temperature of the substrate to a preset temperature or above and then removing the organic film pattern and the portions of the metal layer on the first region.

11. The method of claim 1, wherein the first region has a zigzag shape.

12. The method of claim 11, wherein the hydrophilic-treating the first region of the side surface comprises:

disposing, on the side surface of the substrate, a mask with an opening having a zigzag shape in a way such that the opening overlaps the first region; and discharging, to the first region through the opening having the zigzag shape, plasma generated from a hydrophilic gas.

13. The method of claim 11, wherein the forming the connection wire comprises detaching the first film from the substrate, wherein the connection wire has the zigzag shape.

14. A method of manufacturing a display apparatus, the method comprising:

attaching a removable first film to one of an upper surface and a lower surface of a substrate, adjacent to a side surface of the substrate;

hydrophobic-treating a second region of the side surface of the substrate, wherein the side surface includes a first region and the second region;

providing an organic film pattern on the first region after the hydrophobic-treating the second region of the side surface;

providing a metal layer on the first region and the second region after the providing the organic film pattern; and forming a connection wire by removing the organic film pattern and portions of the metal layer on the first region.

15. The method of claim 14, wherein the hydrophobic-treating the second region of the side surface comprises performing a plasma treatment on the second region.

16. The method of claim 14, wherein the hydrophobic-treating the second region of the side surface comprises:

disposing, on the side surface of the substrate, a mask with an opening in a way such that the opening overlaps the second region; and discharging, to the second region through the opening, plasma generated from a hydrophobic gas.

17. The method of claim 14, wherein the hydrophobic-treating the second region of the side surface comprises, while moving a discharge outlet from one end of the side surface to another end of the side surface, discharging plasma generated from a hydrophobic gas, from the discharge outlet to the second region.

18. The method of claim 14, further comprising:

attaching a removable first masking film to one of the upper surface and the lower surface of the substrate, adjacent to the side surface of the substrate; and attaching a removable second masking film to the other of the upper surface and the lower surface of the substrate.

* * * * *